(12) United States Patent
Li et al.

(10) Patent No.: US 12,154,945 B2
(45) Date of Patent: Nov. 26, 2024

(54) BACKSIDE CMOS TRENCH EPI WITH CLOSE N2P SPACE

(71) Applicant: INTERNATIONAL BUSINESS MACHINES CORPORATION, Armonk, NY (US)

(72) Inventors: Tao Li, Slingerlands, NY (US); Ruilong Xie, Niskayuna, NY (US); Julien Frougier, Albany, NY (US); Nicolas Jean Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 313 days.

(21) Appl. No.: 17/932,679

(22) Filed: Sep. 16, 2022

(65) Prior Publication Data

US 2024/0096940 A1    Mar. 21, 2024

(51) Int. Cl.
| | | |
|---|---|---|
| *H01L 29/06* | (2006.01) | |
| *H01L 21/768* | (2006.01) | |
| *H01L 23/48* | (2006.01) | |
| *H01L 23/528* | (2006.01) | |

(52) U.S. Cl.
CPC .... *H01L 29/0649* (2013.01); *H01L 21/76898* (2013.01); *H01L 23/481* (2013.01); *H01L 23/5286* (2013.01)

(58) Field of Classification Search
CPC .......... H01L 29/0649; H01L 29/42392; H01L 29/66439; H01L 29/66545; H01L 29/775; H01L 29/78696; H01L 21/76898; H01L 23/481; H01L 23/5286
See application file for complete search history.

(56) References Cited

U.S. PATENT DOCUMENTS

| | | | |
|---|---|---|---|
| 5,841,197 A | 11/1998 | Adamic, Jr. | |
| 9,269,713 B2 | 2/2016 | Irsigler | |
| 10,134,945 B1 | 11/2018 | Liu | |
| 12,002,850 B2 * | 6/2024 | Cheng | H01L 27/092 |
| 12,080,776 B2 * | 9/2024 | Jhan | H01L 29/0649 |
| 12,087,772 B2 * | 9/2024 | Hsu | H01L 21/823878 |
| 2020/0303509 A1 | 9/2020 | Mehandru | |

(Continued)

FOREIGN PATENT DOCUMENTS

WO    2022015926 A1    1/2022

*Primary Examiner* — Dao H Nguyen
(74) *Attorney, Agent, or Firm* — Samuel A. Waldbaum

(57) ABSTRACT

A microelectronic structure including a first transistor including a plurality a first channel layers. A second transistor including a plurality of second channel layers, where the first transistor is located adjacent to the second transistors. A dielectric bar located between the first transistor and the second transistor. A first source/drain of the first transistor is located on a first side of the dielectric bar and a second source/drain of the second transistor is located on a second side of the dielectric bar, where the first side is opposite the second side. A first backside contact connected to the first source/drain, where the first backside contact is in contact with first side of the dielectric bar. A second backside contact connected to the second source/drain, where the second backside contact is in contact with the second side of dielectric bar.

20 Claims, 34 Drawing Sheets

Cross section Y₂

(56) References Cited

U.S. PATENT DOCUMENTS

| | | |
|---|---|---|
| 2021/0074823 A1 | 3/2021 | Glass |
| 2021/0111115 A1 | 4/2021 | Morrow |
| 2021/0134721 A1 | 5/2021 | Chiang |
| 2021/0202385 A1 | 7/2021 | Huang |
| 2021/0305252 A1 | 9/2021 | Chiang |
| 2021/0305381 A1 | 9/2021 | Chiang |
| 2021/0351303 A1 | 11/2021 | Ju |
| 2021/0376071 A1 | 12/2021 | Liu |
| 2021/0376093 A1 | 12/2021 | Chu |
| 2022/0406715 A1* | 12/2022 | Xie .................... H01L 21/0259 |
| 2023/0299000 A1* | 9/2023 | Xie ...................... H01L 29/401 |
| | | 257/401 |
| 2024/0282671 A1* | 8/2024 | Chen .................... H01L 23/481 |

* cited by examiner

TOP-DOWN VIEW

Cross section $Y_1$

Cross section $Y_1$

Cross section $Y_1$

Cross section Y₂

Cross section Y₁

Cross section X

Cross section Y₂

Cross section Y₁

Cross section X

Cross section Y₂

Cross section Y₁

Cross section X

Cross section Y₂

Cross section Y₁

Cross section X

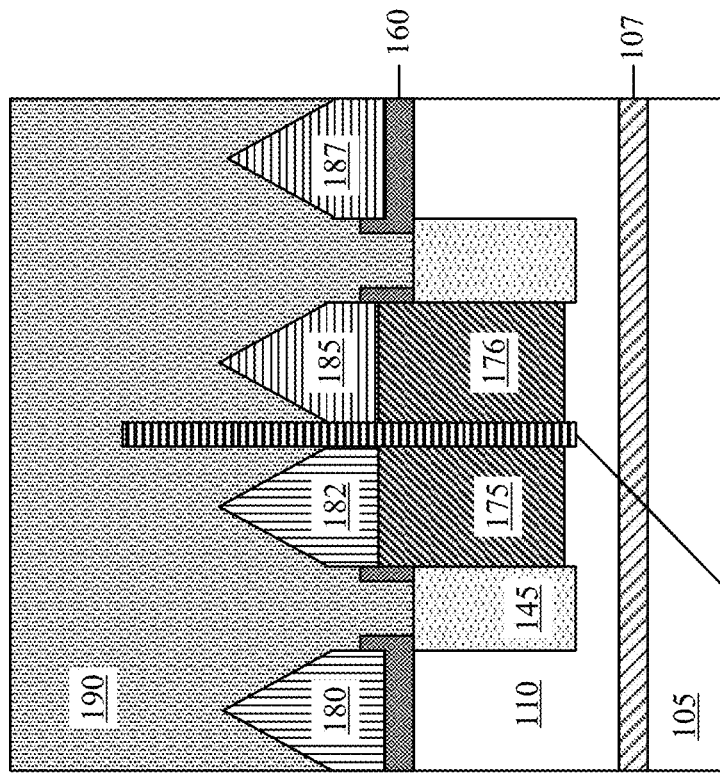
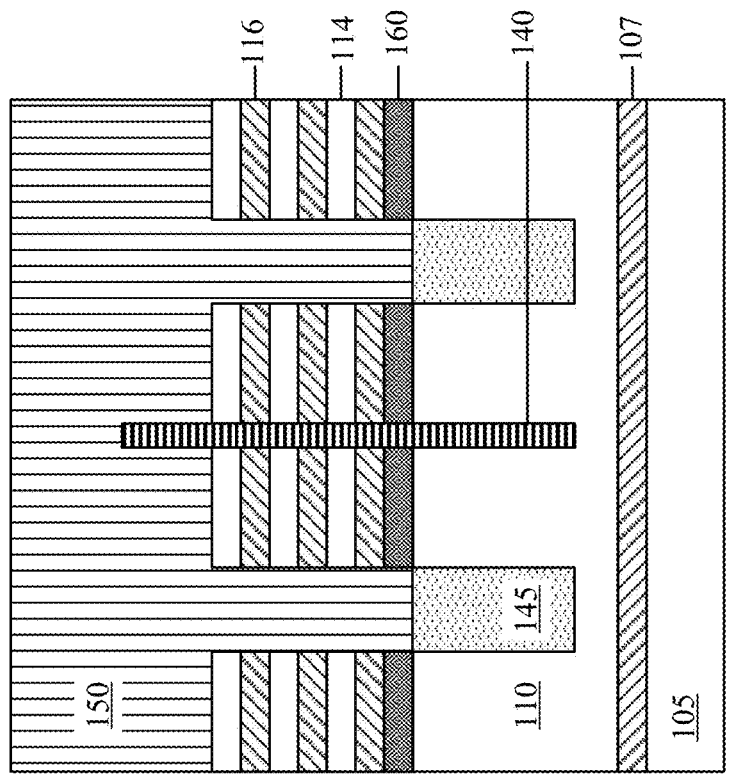
FIG. 18
Cross section Y₂
FIG. 17
Cross section Y₁

Cross section X

Cross section Y₂

Cross section Y₁

Cross section X

Cross section Y₂

Cross section Y₁

Cross section X

Cross section Y₂

Cross section Y₁

Cross section X

Cross section Y₂

Cross section Y₁

Cross section X

Cross section $Y_2$

Cross section $Y_1$

Cross section X

Cross section $Y_2$

Cross section $Y_1$

Cross section X

Cross section $Y_2$

Cross section $Y_1$

Cross section X

Cross section $Y_2$

Cross section $Y_1$

Cross section X

Cross section $Y_2$

Cross section $Y_1$

Cross section X

Cross section Y₂

Cross section Y₁

Cross section X

BACKSIDE CMOS TRENCH EPI WITH CLOSE N2P SPACE

BACKGROUND

The present invention generally relates to the field of microelectronic, and more particularly to formation of a backside source/drain epi with a high doping concentration.

Nanosheet is the lead device architecture in continuing CMOS scaling. However, nanosheet technology has shown issues when scaling down such that as the devices become smaller and closer together, they are interfering with each other. When forming backside source/drain contacts, the contacts can interfere with each other.

BRIEF SUMMARY

Additional aspects and/or advantages will be set forth in part in the description which follows and, in part, will be apparent from the description, or may be learned by practice of the invention.

A microelectronic structure including a first transistor including a plurality a first channel layers. A second transistor including a plurality of second channel layers, where the first transistor is located adjacent to the second transistors. A dielectric bar located between the first transistor and the second transistor. A first source/drain of the first transistor is located on a first side of the dielectric bar and a second source/drain of the second transistor is located on a second side of the dielectric bar, where the first side is opposite the second side. A first backside contact connected to the first source/drain, where the first backside contact is in contact with first side of the dielectric bar. A second backside contact connected to the second source/drain, where the second backside contact is in contact with the second side of dielectric bar.

A microelectronic structure including a first transistor including a plurality a first channel layers. A second transistor including a plurality of second channel layers, where the first transistor is located adjacent to the second transistors. A dielectric bar located between the first transistor and the second transistor. A first source/drain of the first transistor is comprised of a first source/drain layer and a second source/drain layer. The second source/drain layer is located on the backside of the first source/drain layer, where the first source/drain layer and the second source/drain layer are flush against a first sidewall of the dielectric bar. A second source/drain of the second transistor comprised of a third source/drain layer and the fourth source/drain layer. The fourth source/drain layer is located on the backside of the third source/drain layer, where the third source/drain layer and the fourth source/drain layer are flush against a second sidewall of the dielectric bar.

A method including the steps of forming a first transistor including a plurality a first channel layers. Forming a second transistor including a plurality of second channel layers, where the first transistor is located adjacent to the second transistors. Forming a dielectric bar located between the first transistor and the second transistor. Forming a first source/drain of the first transistor is located on a first side of the dielectric bar and a second source/drain of the second transistor is located on a second side of the dielectric bar, where the first side is opposite the second side. Forming a first backside contact connected to the first source/drain, where the first backside contact is in contact with first side of the dielectric bar. Forming a second backside contact connected to the second source/drain, where the second backside contact is in contact with the second side of dielectric bar.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 17 illustrates a cross section Y1 of the gate region after the formation of a first type of source/drain, a second type of source/drain, and a frontside interlayer dielectric layer, in accordance with the embodiment of the present invention.

FIG. 18 illustrates a cross section Y2 of the source/drain region after the formation of a first type of source/drain, a second type of source/drain, and a frontside interlayer dielectric layer, in accordance with the embodiment of the present invention.

DETAILED DESCRIPTION

Figure 1:
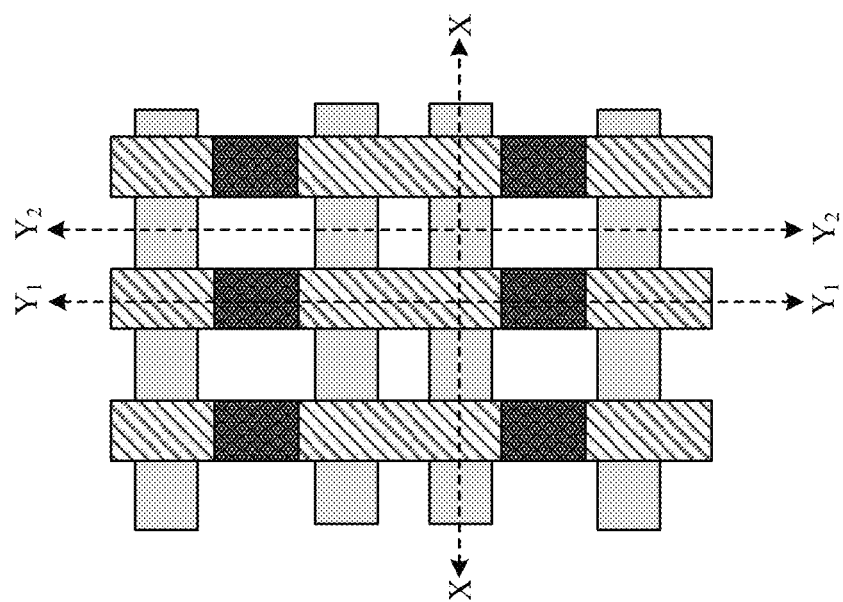
FIG. 1 illustrates a top-down view of multiple nano devices, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed to a dielectric bar located between two source/drains, where each of the source/drains is flush against a sidewall of the dielectric bar. Each of the source/drains is comprised of a first source/drain material having a first doping concentration, and a second source/drain material having a second doping concentration. The second doping concentration is a higher concentration when compared to the first doping concentration. Contacts are connected to each of the source/drains and each of the contacts is flush against a side wall of the dielectric bar.

FIG. 1 illustrates a top-down view of multiple devices, in accordance with the embodiment of the present invention. The cross-section X extends horizontally through one of the nano stacks of one of the multiple devices. Cross section $Y_1$ is perpendicular to cross section X, where cross section $Y_1$ is through a gate region that spans across multiple devices. Cross section $Y_2$ is perpendicular to cross section X, where cross section $Y_2$ is through the source/drain region of multiple devices.

Figure 2:
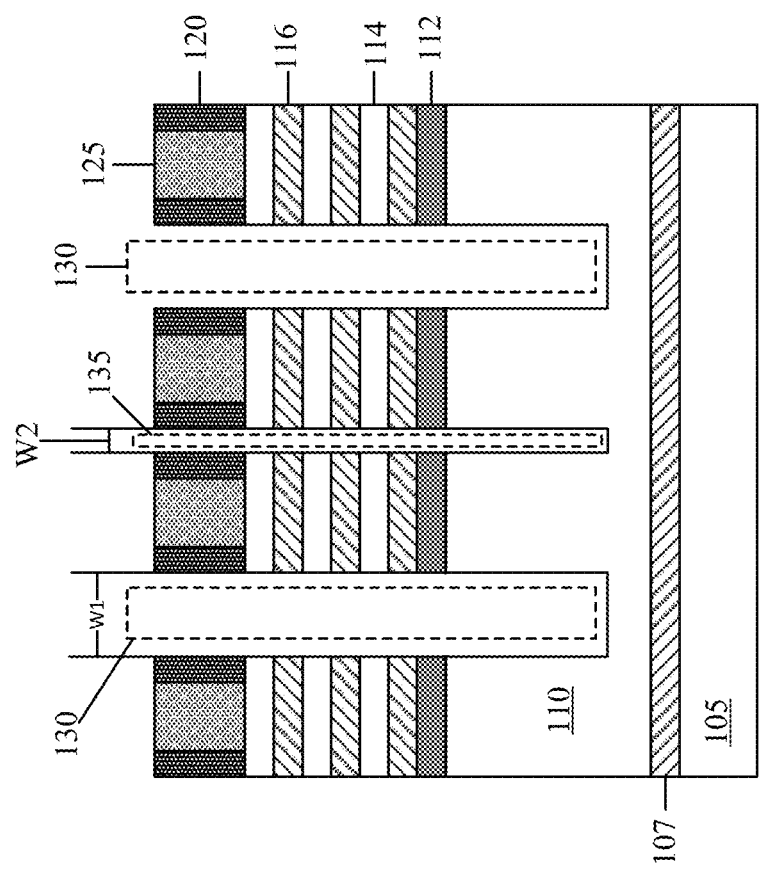
FIG. 2 illustrates a cross section Y1 of the nano stack after the formation of trenches to separate the nano layers into individual nano stacks, in accordance with the embodiment of the present invention.

FIG. 2 illustrates the processing stage after the alternating layers were etched into a plurality of nano columns, where each of the nano columns includes a nano stack. The device includes a first substrate 105, an etch stop 107, and a second substrate 110. The substrate 105 and the second substrate 110 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 and the second substrate 110 includes both semiconductor materials and dielectric materials. The semiconductor substrate 105 and the second substrate 110 may also comprise an organic semiconductor or a layered semiconductor such as, for example, Si/SiGe, a silicon-on-insulator or a SiGe-on-insulator. A portion or the entire semiconductor substrate 105 and the second substrate 110 may also be comprised of an amorphous, polycrystalline, or monocrystalline. The semiconductor substrate 105 and the second substrate 110 may be doped, undoped or contain doped regions and undoped regions therein.

A first sacrificial layer 112 is formed on top of the second substrate 110. The first sacrificial layer 112 can be comprised of SiGe, where Ge is in the range of about 45% to 70%. Alternating layers of channel layers 114 (nano sheets) and sacrificial layers 116 are located on top of the first sacrificial layer 112. The plurality of sacrificial layers 116 can be comprised of SiGe, where Ge is in the range of about 15% to 35%. One of the channel layers 114 is located above each of the sacrificial layers 116. The plurality of channel layers 114 can be comprised of, for example, Si. The number of layers illustrated in the figures is for illustrative purposes only, the number of alternating layers can be higher or lower than what is illustrated in FIG. 2. A hardmask 125 is formed and patterned and a first spacer 120 is formed adjacent to the hardmask prior to etching the alternating layers. The alternating layers are etched to form a plurality of columns (alternating layer columns or nano columns) comprised of the alternating layers. The etching process forms a plurality of first trenches 130 and a second trench 135. The plurality of first trenches 130 have a width W1 and the second trench 135 has a width W2. The width W2 is smaller than the width W1. The plurality of first trenches 130 and the second trench 135 extends downwards in to the second substrate 110.

Figure 3:
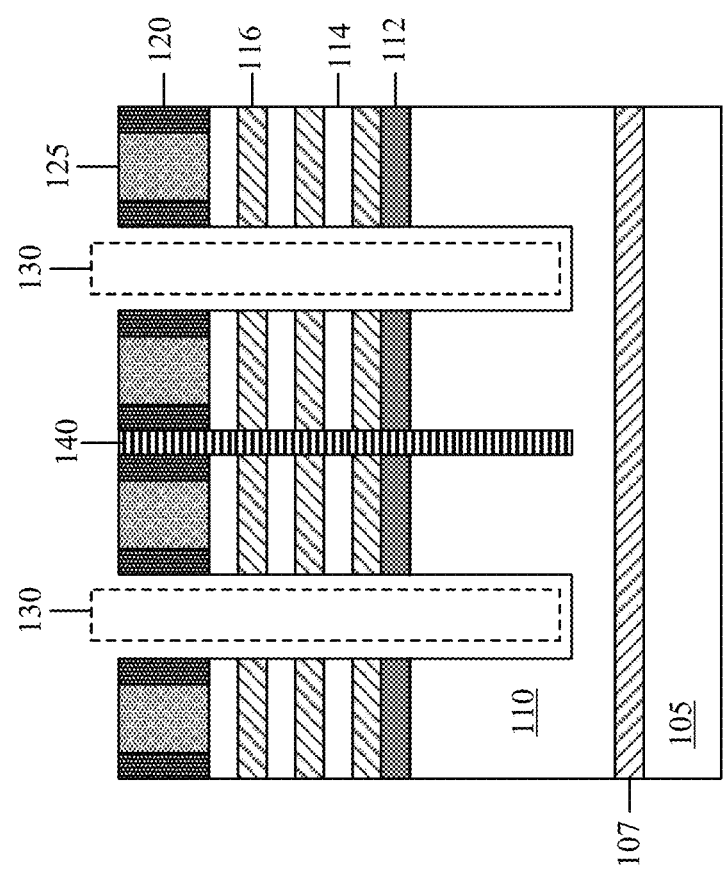
FIG. 3 illustrates a cross section Y1 of the nano stack after the formation of a dielectric bar, in accordance with the embodiment of the present invention.

FIG. 3 illustrates the processing stage after the formation of a dielectric bar 140. The second trench 135 is filled with a dielectric material by, for example, atomic layer deposition (ALD), followed by an isotropic etch back to form a dielectric bar 140. A first sidewall of the dielectric bar 140 is flush against a first column of alternating layers, and a second sidewall of the dielectric bar 140 is flush against a second column of alternating layers. Therefore, the channel layers 114 and sacrificial layers 116 of the first column of alternating layers are flush against the first sidewall of the dielectric bar 140. The channel layers 114 and sacrificial layers 116 of the second column of alternating layers are flush against the second sidewall of the dielectric bar 140. The dielectric bar 140 has a top surface that is flush with a top surface of the hardmask 125, thus the dielectric bar 140 extends higher than the alternating layers. The dielectric bar 140 also extends downwards into the second substrate 110.

Therefore, the dielectric bar 140 extends below the alternating layers into the second substrate 110.

Figure 4:
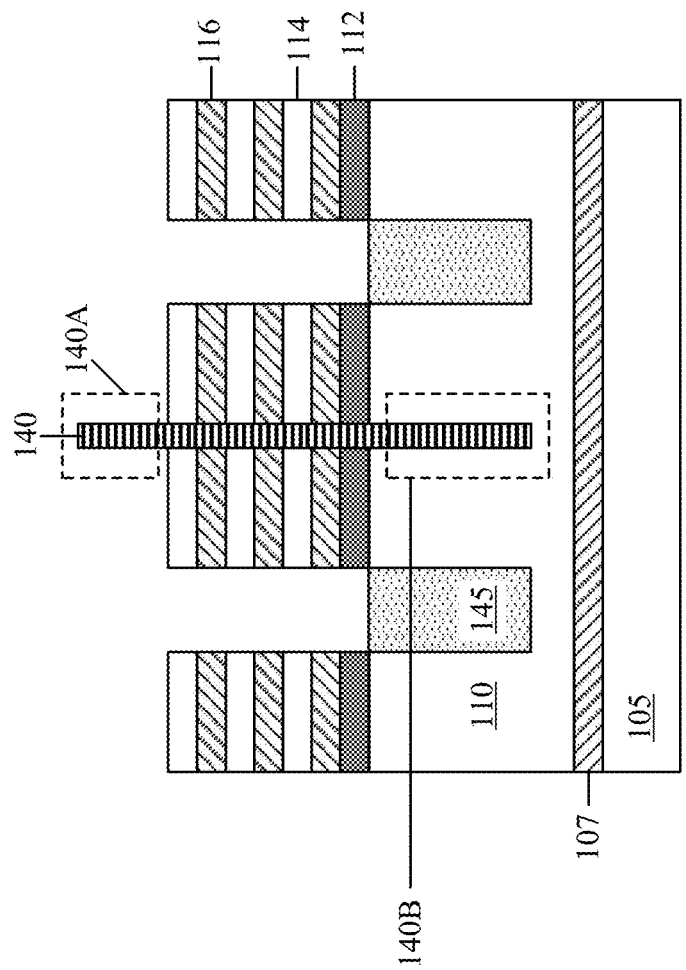
FIG. 4 illustrates a cross section Y1 of the nano stack after the removal the hardmask and the formation of the shallow trench isolation layer, in accordance with the embodiment of the present invention.

FIG. 4 illustrates the processing stage after the removal of the hardmask 125 and the first spacer 120, and the formation of the shallow trench isolation layer 145. The shallow trench isolation layer 145 is formed in the plurality of the first trenches 130, where the shallow trench isolation layer 145 is located in the second substrate 110. As illustrated in FIG. 4, a portion of the dielectric bar 140, as emphasized by dashed box 140A, extends above the top layer (either a channel layer 114, as illustrated, or a sacrificial layer 116) of the alternating layer columns. Furthermore, the dielectric bar 140 has a second portion, as illustrated by dashed box 140B, that extends below the alternating layer columns in to the second substrate 110.

Figure 6:
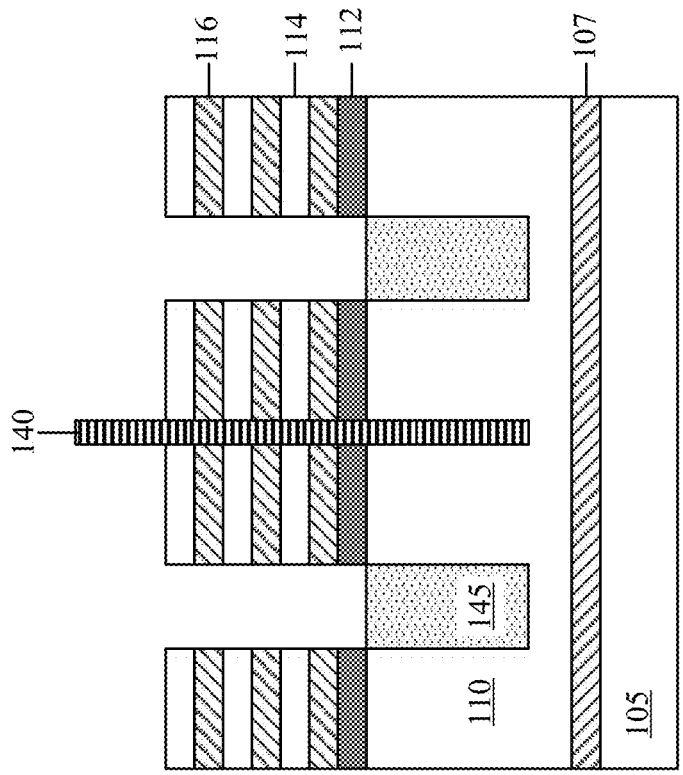
FIG. 6 illustrates a cross section Y2 of the source/drain region after formation of a dummy gate, and a second hardmask, in accordance with the embodiment of the present invention.
Figure 5:
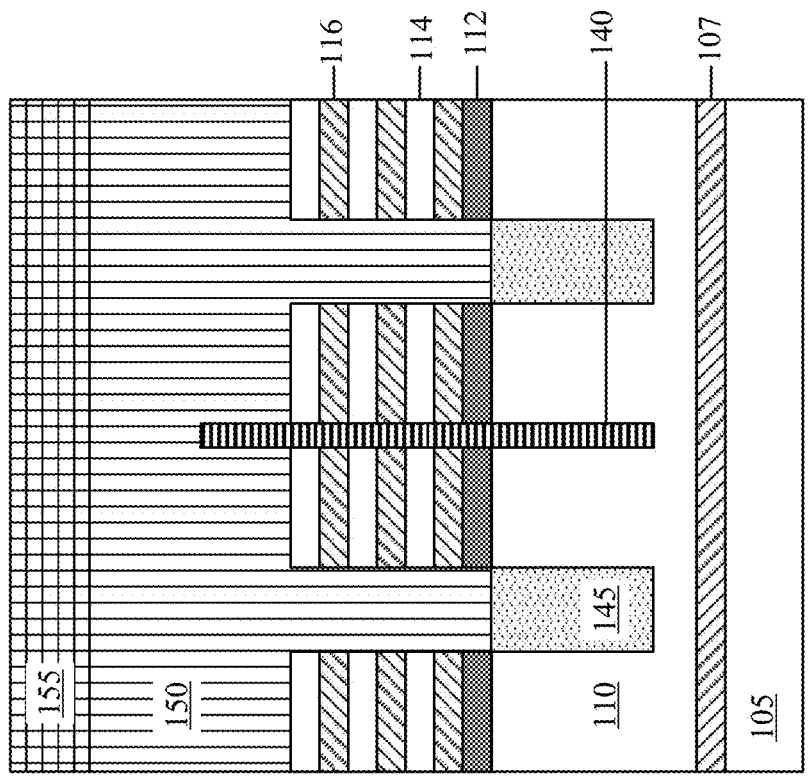
FIG. 5 illustrates a cross section Y1 of the gate region after formation of a dummy gate and a second hardmask, in accordance with the embodiment of the present invention.
Figure 7:
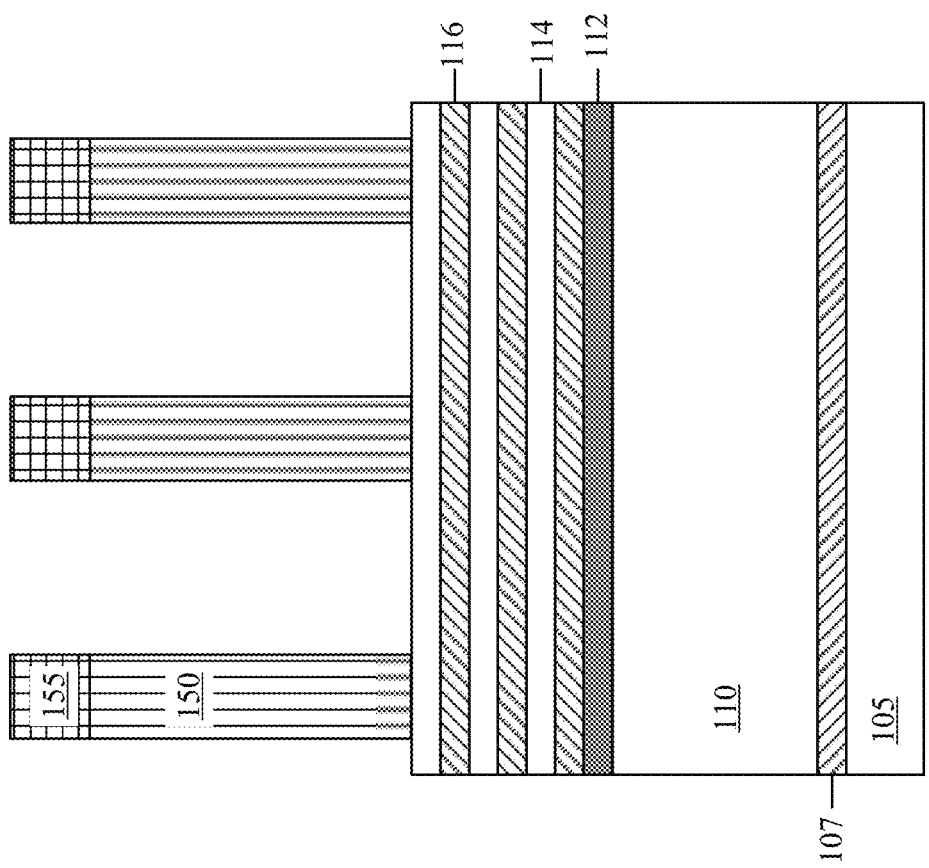
FIG. 7 illustrates a cross section X of the across the nano device after formation of a dummy gate and a second hardmask, in accordance with the embodiment of the present invention.

FIGS. 5, 6, and 7 illustrates the processing stage after the formation of a dummy gate 150, and a second hardmask 155. A dummy gate 150 is formed on the exposed surfaces and a second hardmask 155 is formed on top of the dummy gate 150. The second hardmask 155 and the dummy gate 150 are patterned so that the dummy gate 150 and the second hardmask 155 remain in the gate region of the devices. FIG. 5 illustrates the gate region of cross-section $Y_1$, and FIG. 7 illustrates multiple gate regions located on top of the top layer of the alternating layers.

Figure 9:
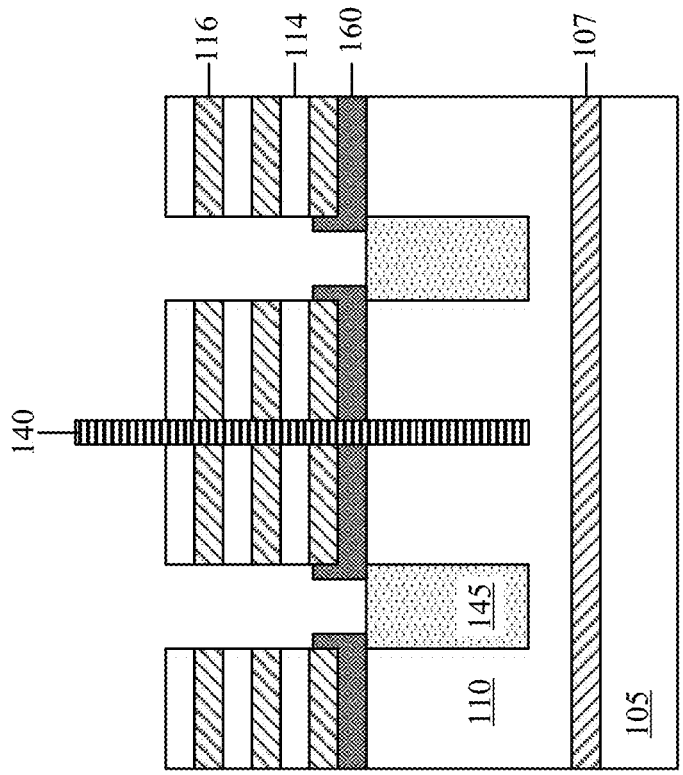
FIG. 9 illustrates a cross section Y2 of the source/drain region after the after formation of a bottom dielectric isolation layer and an upper spacer, in accordance with the embodiment of the present invention.
Figure 8:
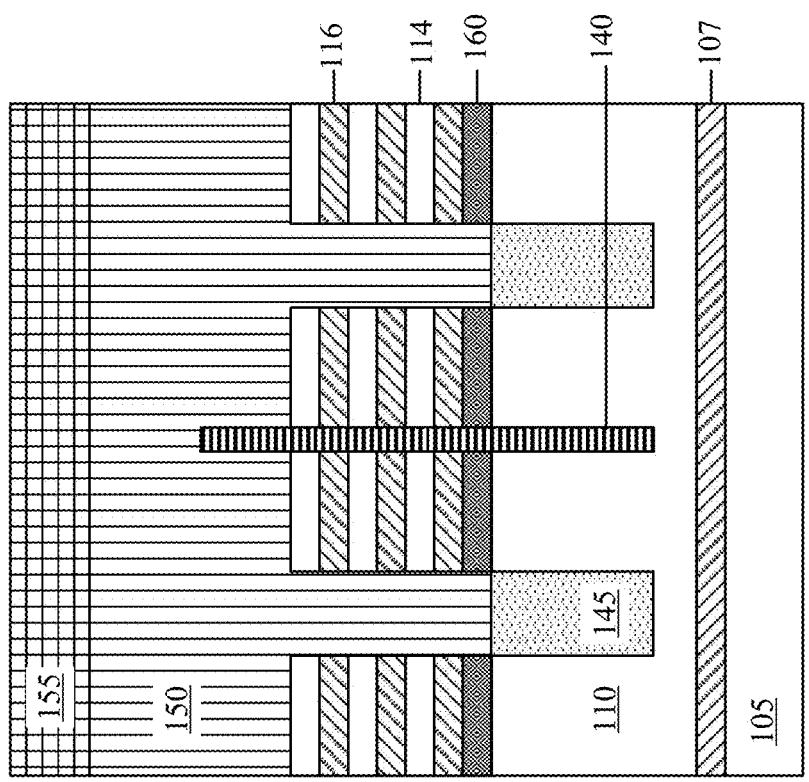
FIG. 8 illustrates a cross section Y1 of the gate region after formation of a bottom dielectric isolation layer and an upper spacer, in accordance with the embodiment of the present invention.
Figure 10:
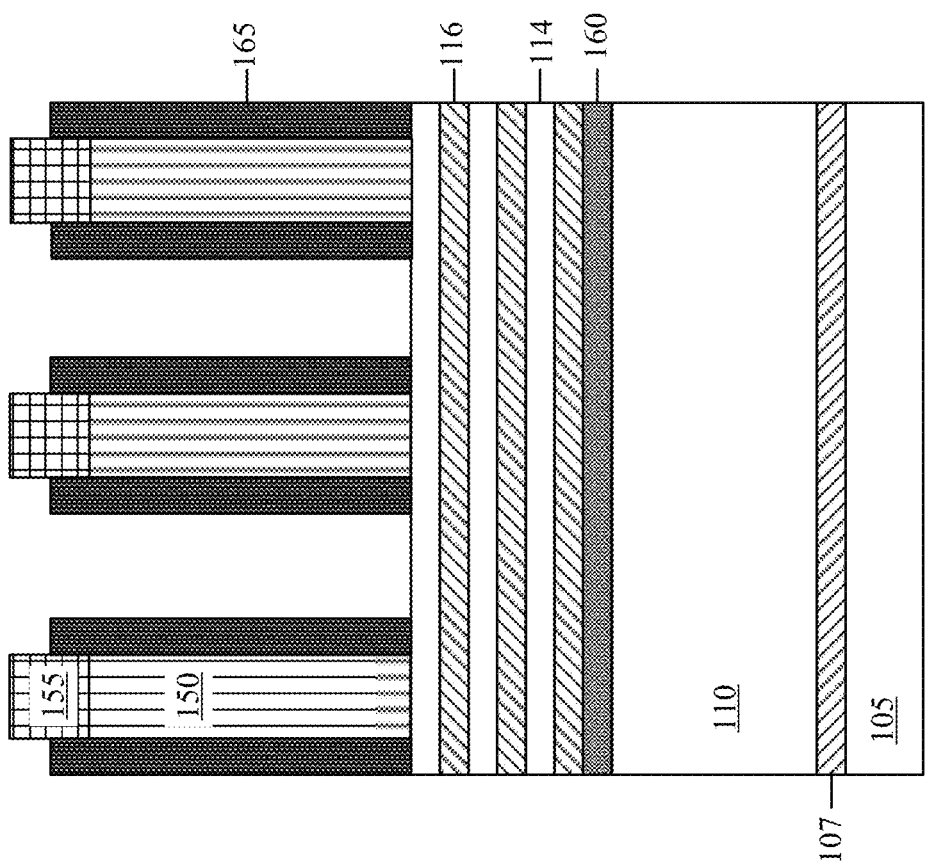
FIG. 10 illustrates a cross section X of the across the nano device after formation of a bottom dielectric isolation layer and an upper spacer, in accordance with the embodiment of the present invention.

FIGS. 8, 9, and 10 illustrates the processing stage after the formation of a bottom dielectric isolation layer 160, and an upper spacer 165. The upper spacer 165 is formed along the sidewalls of the dummy gate 150 as illustrated by FIG. 10. The first sacrificial layer 112 is selectively removed to create a space for the formation of the bottom dielectric isolation layer 160. The first sacrificial layer 112 can be selectively removed because of the higher concentration of Ge when compared to the sacrificial layers 116. The bottom dielectric isolation layer 160 is located between the second substrate 110 and a bottom layer of the alternating layers of the nano column. As illustrated by FIG. 9, the bottom dielectric isolation layer 160 can wrap around the bottom edge of the bottom layer of the alternating layers of the nano column.

Figure 12:
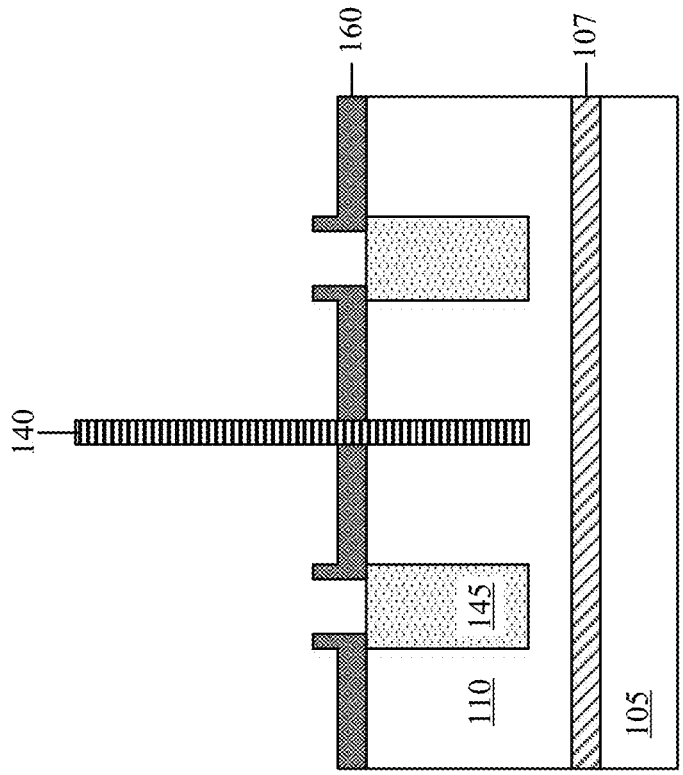
FIG. 12 illustrates a cross section Y2 of the source/drain region after the after the removal of the alternating nano layers in the source/drain region, recessing the sacrificial layers and formation of the inner spacer, in accordance with the embodiment of the present invention.
Figure 11:
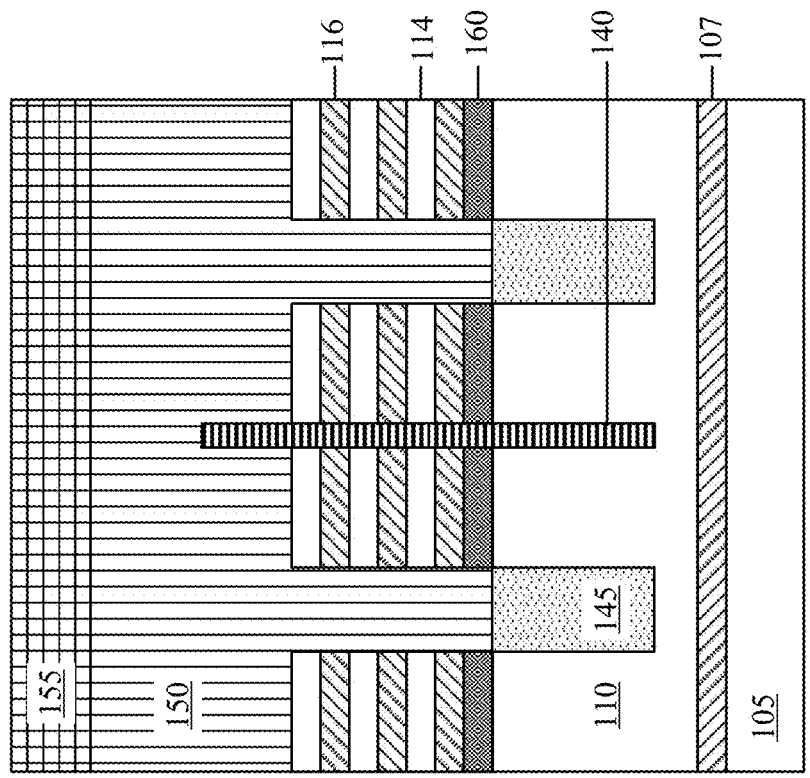
FIG. 11 illustrates a cross section Y1 of the gate region after the removal of the alternating nano layers in the source/drain region, recessing the sacrificial layers and formation of the inner spacer, in accordance with the embodiment of the present invention.
Figure 13:
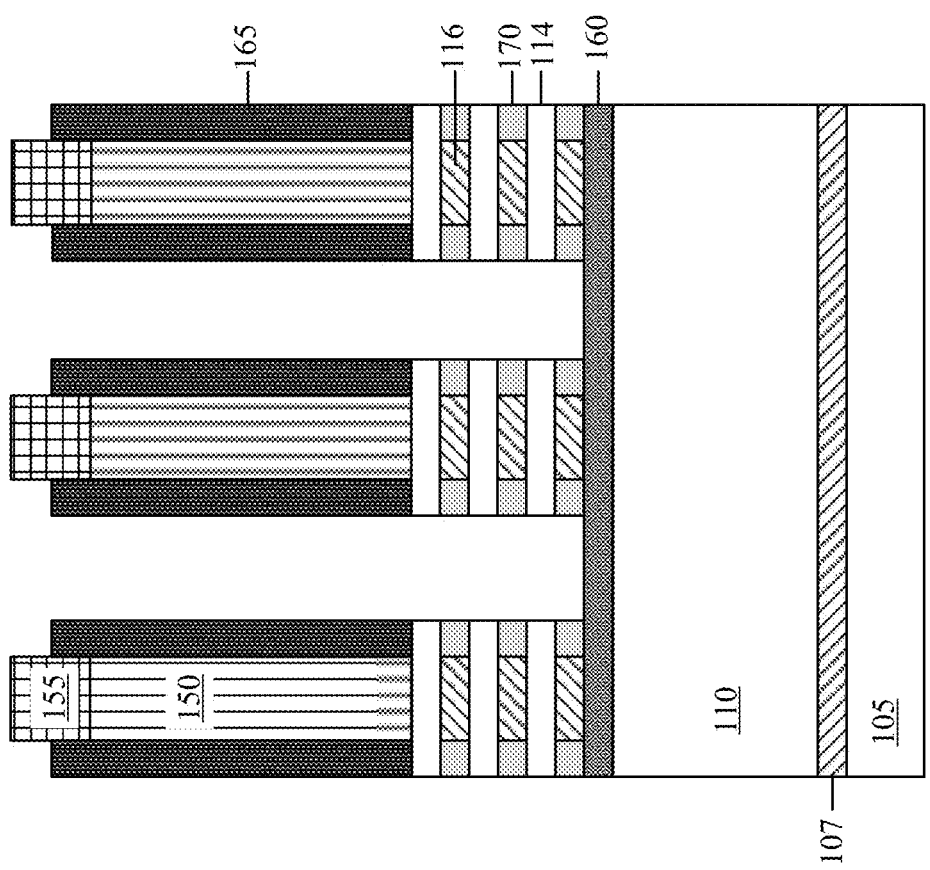
FIG. 13 illustrates a cross section X of the across the nano device after the removal of the alternating nano layers in the source/drain region, recessing the sacrificial layers and formation of the inner spacer, in accordance with the embodiment of the present invention.

FIGS. 11, 12, and 13 illustrates the processing stage after the removal of the alternating layers in the source/drain region, recessing the sacrificial layers 116, and the formation of the inner spacer 170. The alternating layer columns located in the source/drain region are etched create space for the formation of the source/drain as illustrated in FIGS. 12 and 13. The bottom dielectric isolation layer 160 remains in the source/drain region as illustrated by FIG. 12. Two different sections of the bottom dielectric isolation layer 160 are located flush against opposite sidewalls of the dielectric bar 140, respectively. The sacrificial layers 116 are recessed to create an empty space (not shown) between the alternating layers, and this empty space is filled with an inner spacer 170.

Figure 15:
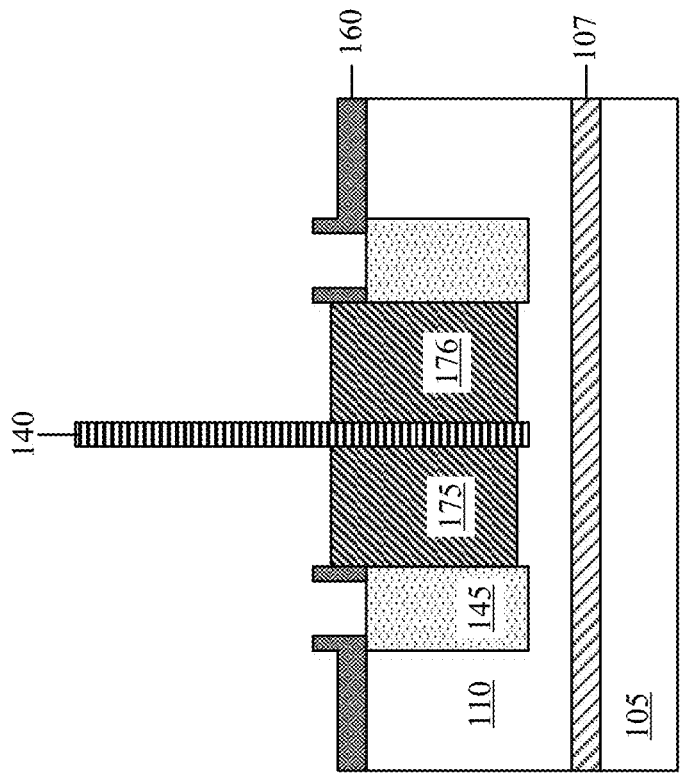
FIG. 15 illustrates a cross section Y2 of the source/drain region after the formation of a first backside placeholder and a second backside placeholder, in accordance with the embodiment of the present invention.
Figure 14:
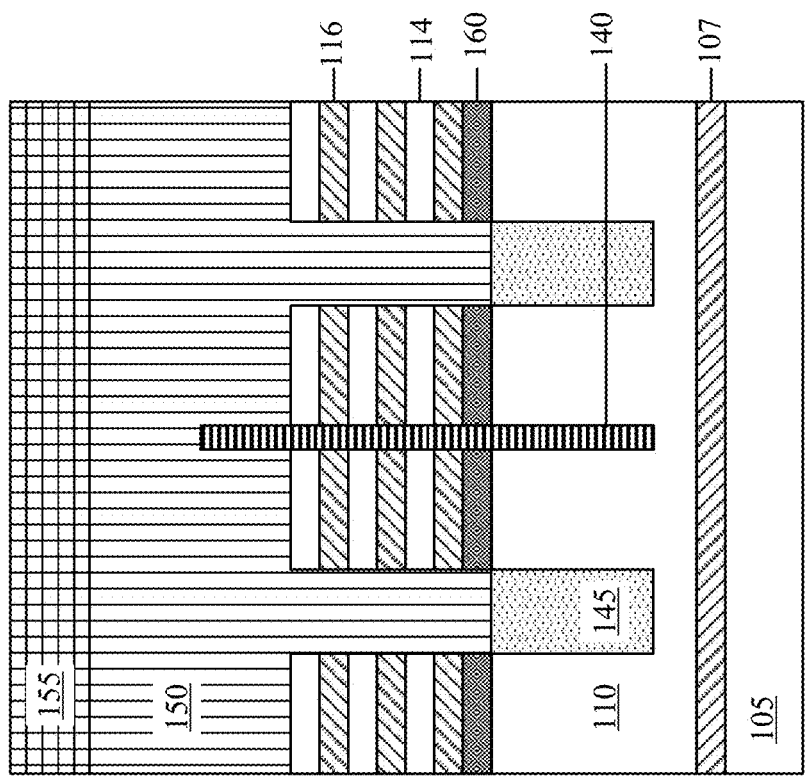
FIG. 14 illustrates a cross section Y1 of the gate region after the formation of a first backside placeholder and a second backside placeholder, in accordance with the embodiment of the present invention.
Figure 16:
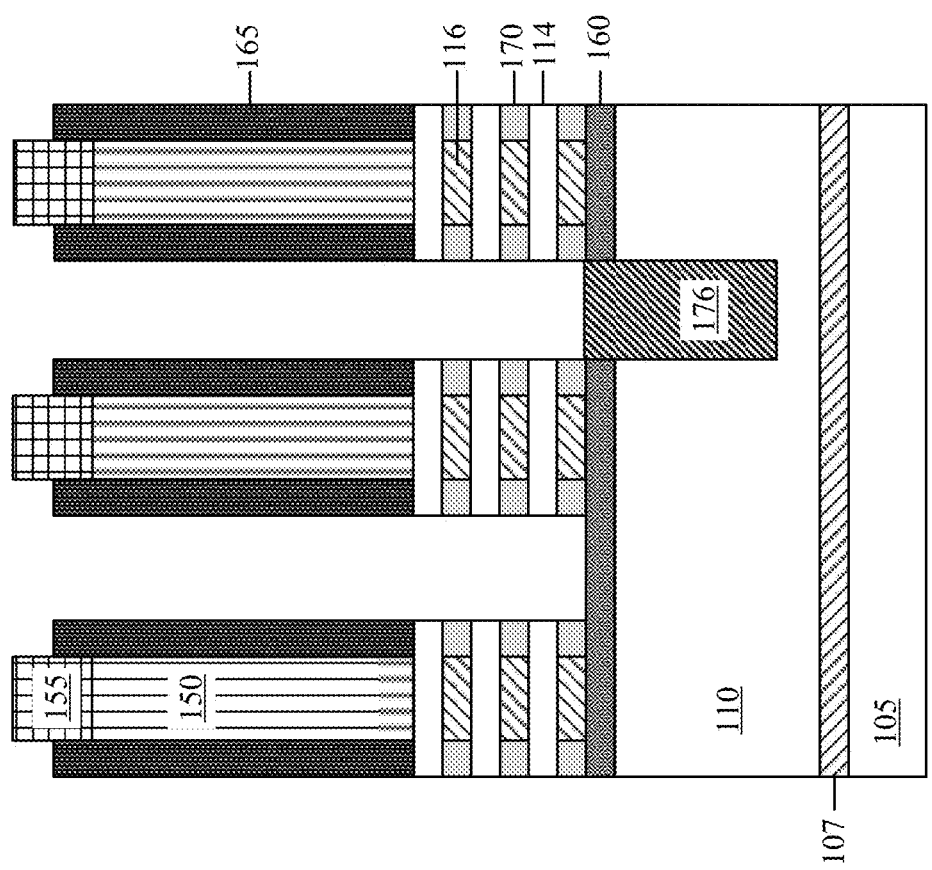
FIG. 16 illustrates a cross section X of the across the nano device after the formation of a first backside placeholder and a second backside placeholder, in accordance with the embodiment of the present invention.

FIGS. 14, 15, and 16 illustrates the processing stage after the formation of a first backside placeholder 175 and a second backside placeholder 176. A trench (not shown) is created in the second substrate 110 by removing a portion of the bottom dielectric isolation layer 160 and the section substrate 110 located between the dielectric bar 140 and the shallow trench isolation layer 145. The trenches are filled in with a placeholder material to form the first backside placeholder 175 and the second backside placeholder 176. The first backside placeholder 175 has a first sidewall flush against the dielectric bar 140. The first backside placeholder 175 has a second sidewall flush against the shallow trench isolation layer 145 and a portion of the bottom dielectric isolation layer 160. The second backside placeholder 176 has a first sidewall flush against the dielectric bar 140. The second backside placeholder 176 has a second sidewall flush against the shallow trench isolation layer 145 and a portion of the bottom dielectric isolation layer 160.

Figure 19:
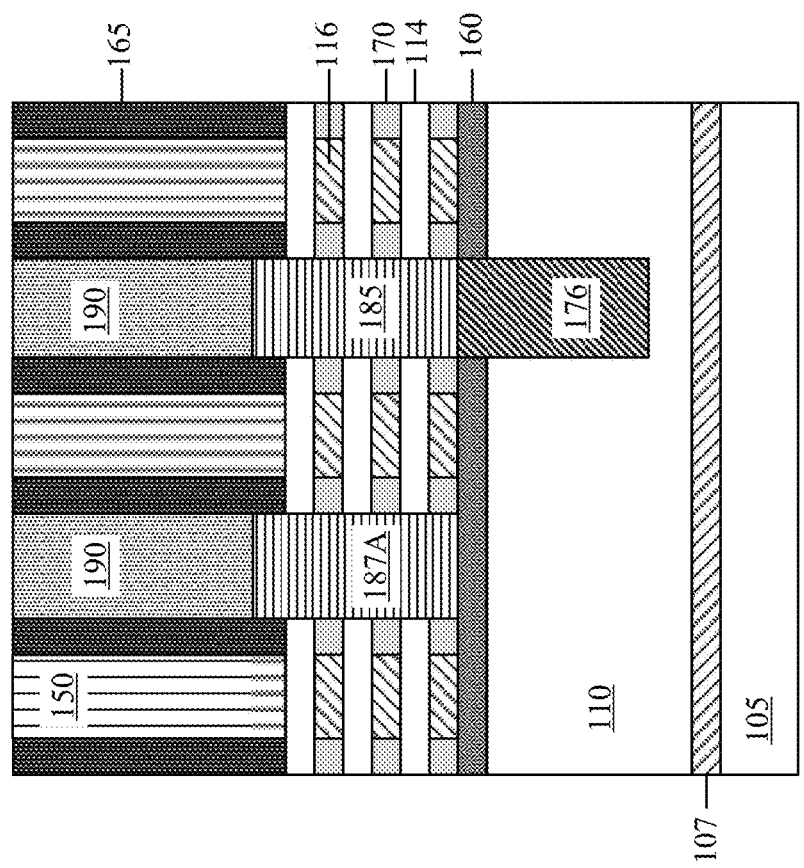
FIG. 19 illustrates a cross section X of the across the nano device after the formation of a first type of source/drain, a second type of source/drain, and a frontside interlayer dielectric layer, in accordance with the embodiment of the present invention.

FIGS. 17, 18, and 19 illustrates the processing stage after the formation of a first type of source/drain 180, 182, a second type of source/drain 185, 187A, 187, and a frontside interlayer dielectric layer 190. One first type of source/drain 180 is formed on the bottom dielectric layer 160 and one first type of source/drain 182 is formed on top of the first backside placeholder 175. The first type of source/drain 182 has a sidewall flush against the dielectric bar 140 and a bottom surface that is flush against the first backside placeholder 175. The first type of source/drain 180, 182 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

A second type of source/drain 187A, 187 is formed on the bottom dielectric layer 160 and one second type of source/drain 185 is formed on top of the second backside placeholder 176. The second type of source/drain 185 has a sidewall flush against the dielectric bar 140 and a bottom surface that is flush against the second backside placeholder 176. The second type of source/drain 185, 187A, 187 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

When the first type of source/drain 180, 182 is a n-type epitaxy then the second type of source/drain 185, 187A, and 187 is a p-type epitaxy. Alternatively, the first type of source/drain 180, 182 is a p-type epitaxy then the second type of source/drain 185, 187A, and 187 is a n-type epitaxy. A frontside interlayer dielectric layer 190 is formed on the exposed surfaces located in the source/drain region. The excess frontside interlayer dielectric layer 190 and the second hardmask 155 is removed.

Figure 21:
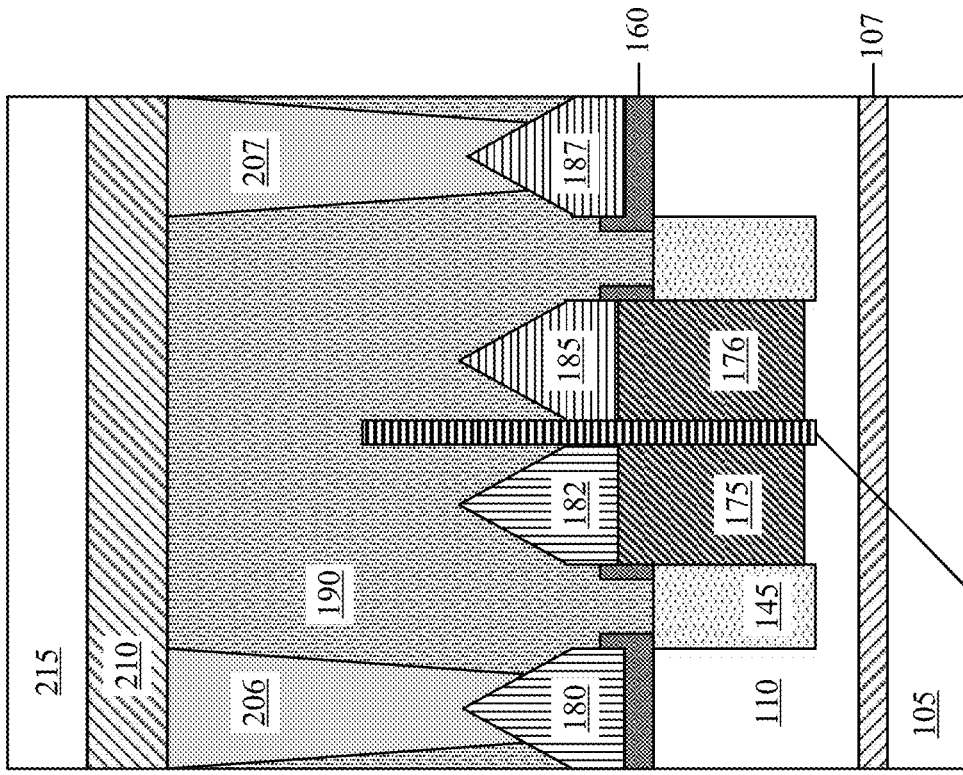
FIG. 21 illustrates a cross section Y2 of the source/drain region after the formation of a gate, additional frontside interlayer dielectric layer, a first source/drain contact, a second source/drain contact, back-end-of-line (BEOL) layer, and a carrier wafer, in accordance with the embodiment of the present invention.
Figure 20:
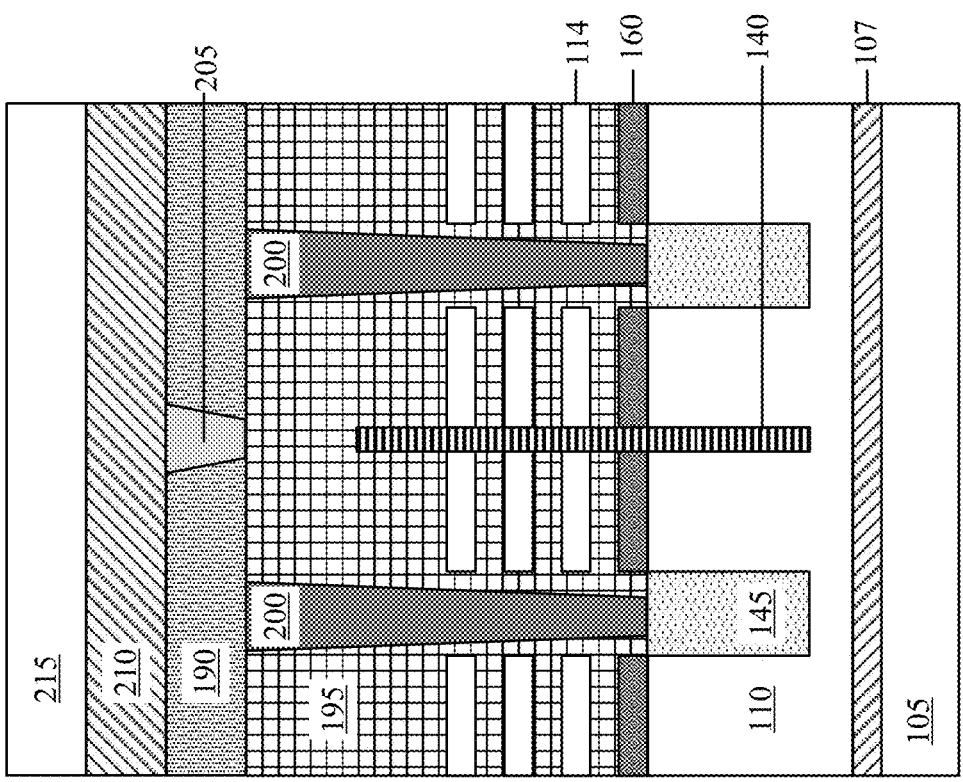
FIG. 20 illustrates a cross section Y1 of the gate region after the formation of a gate cut, a gate, additional frontside interlayer dielectric layer, a gate contact, back-end-of-line (BEOL) layer, and a carrier wafer, in accordance with the embodiment of the present invention.
Figure 22:
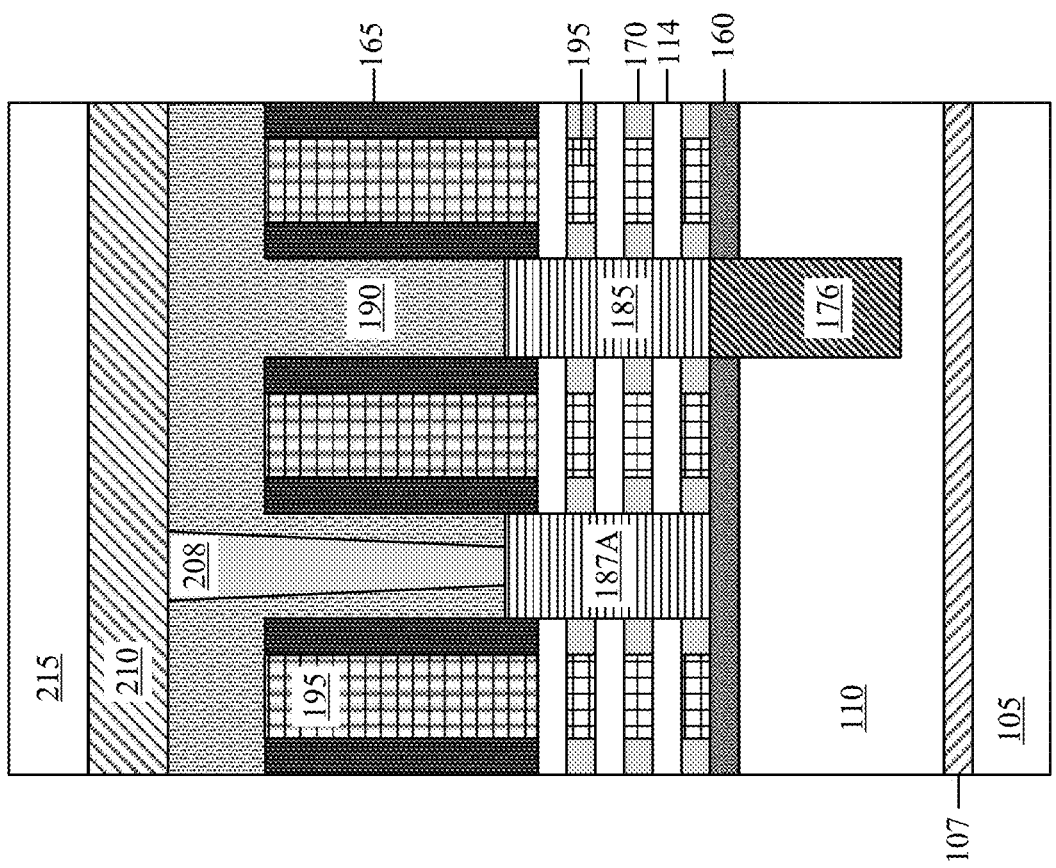
FIG. 22 illustrates a cross section X of the across the nano device after the formation of a gate, additional frontside interlayer dielectric layer, a third source/drain contact, back-end-of-line (BEOL) layer, and a carrier wafer, in accordance with the embodiment of the present invention.

FIGS. 20, 21, and 22 illustrates the processing stage after the formation of a gate cut 200, a gate 195, additional frontside interlayer dielectric layer 190, a gate contact 205, a first source/drain contact 206, a second source/drain contact 207, a third source/drain contact 208, back-end-of-line (BEOL) layer 210, and a carrier wafer 215. A trench is formed in the dummy gate 150 (not shown) and the trench is filled with a dielectric material to form the gate cuts 200. The dummy gate 150 and the sacrificial layers 116 are removed. A gate 195 is formed in the space created by the removal of the dummy gate 150 and the sacrificial layers 116. The gate 195 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. The gate 195 is flush against the sidewalls of the dielectric bar 140. Additional frontside interlayer dielectric material is formed on top of the gate 195 and on top of the gate cuts 200. A gate contact 205 is formed by forming a trench in the frontside interlayer dielectric layer 190 and filling it with a conductive metal. A plurality of trenches (not shown) is formed in the frontside interlayer dielectric layer 190 and filled with a conductive metal to create the source/drain contacts. The first source/drain contact 206 is connected to the first type of source/drain 180, the second source/drain contact 207 is connected to the second type of source/drain 187, and the third source/drain contact 208 is connected to the second type of source/drain 187A. The BEOL layer 210 is formed on top of the frontside interlayer dielectric layer 190 and on top of the first, second, and third source/drain contacts 206, 207, 208. A carrier wafer 215 is formed on top of the BEOL layer 210.

Figure 24:
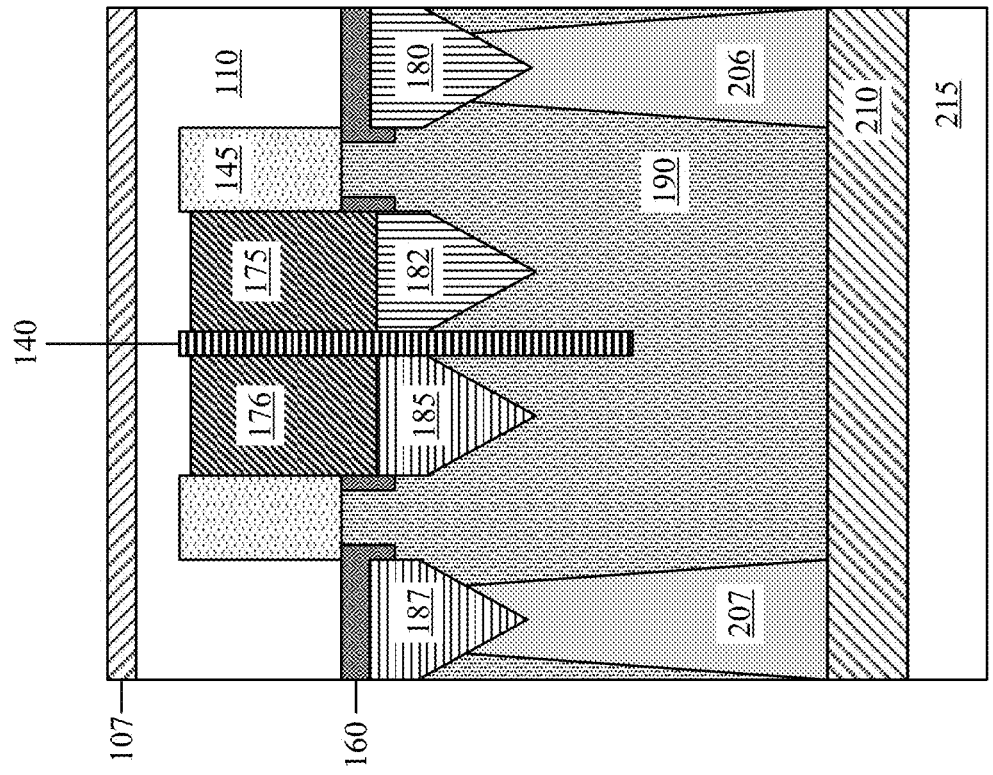
FIG. 24 illustrates a cross section Y2 of the source/drain region after the flipping of the device and the removal of the substrate, in accordance with the embodiment of the present invention.
Figure 23:
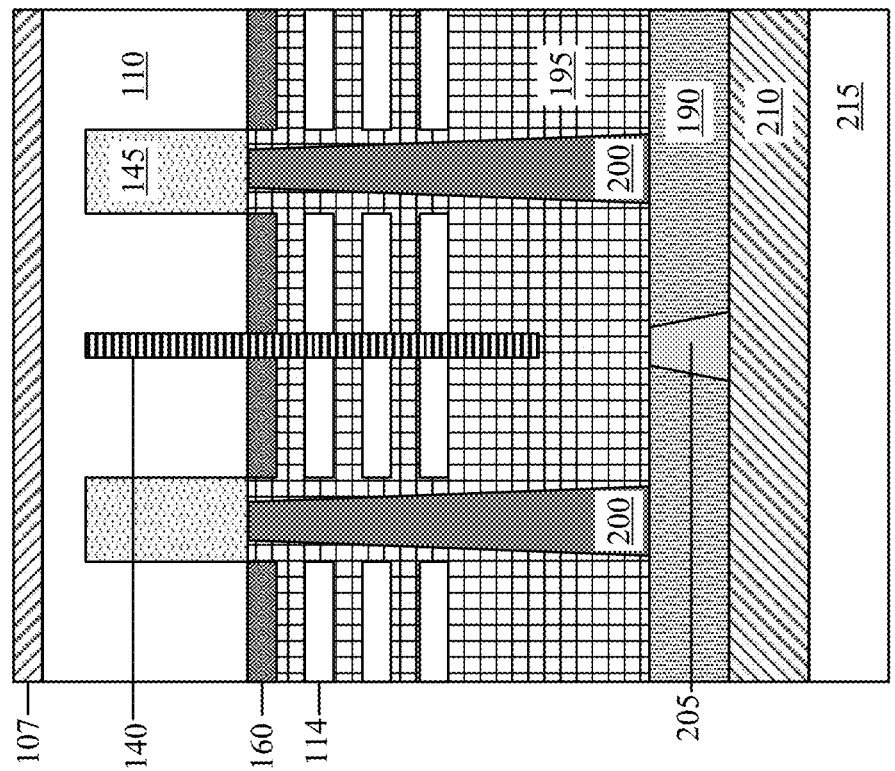
FIG. 23 illustrates a cross section Y1 of the gate region after the flipping of the device and the removal of the substrate, in accordance with the embodiment of the present invention.
Figure 25:
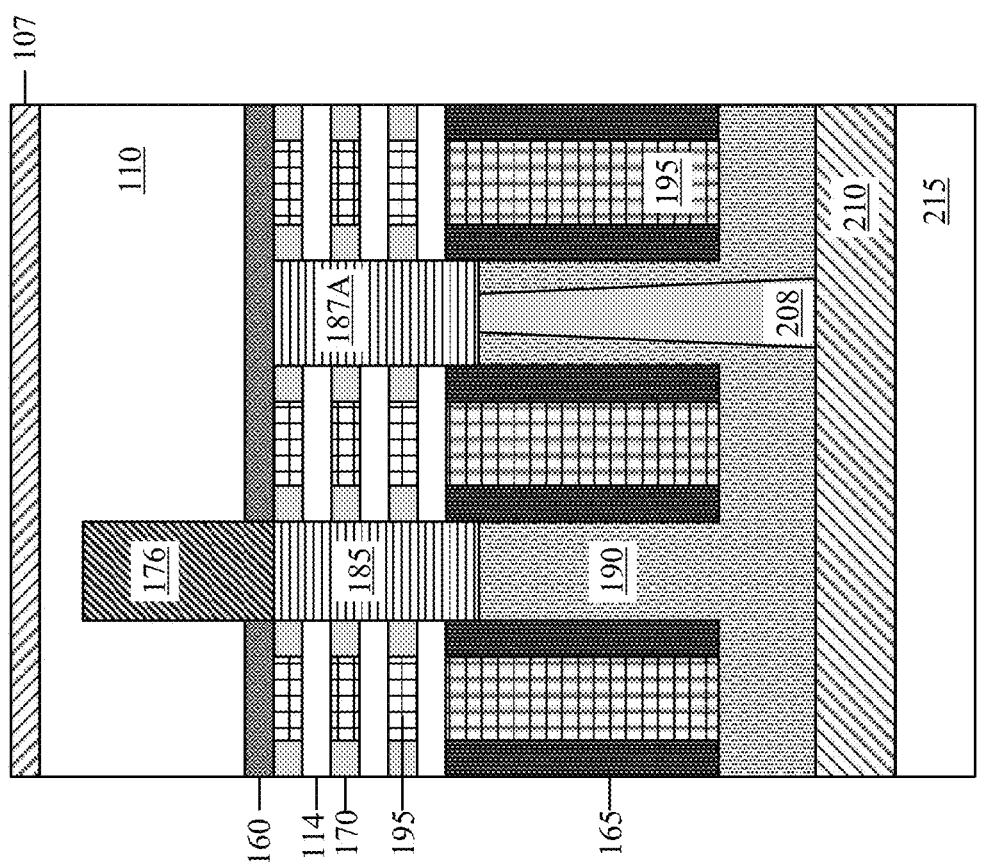
FIG. 25 illustrates a cross section X of the across the nano device after the flipping of the device and the removal of the substrate, in accordance with the embodiment of the present invention.

FIGS. 23, 24, and 25 illustrates the processing stage after the flipping of the device and the removal of the substrate 105. The carrier wafer 215 allows for the device to be flipped over to allow for the backside processing of the device. The substrate 105 is removed exposing the etch stop 107.

Figure 27:
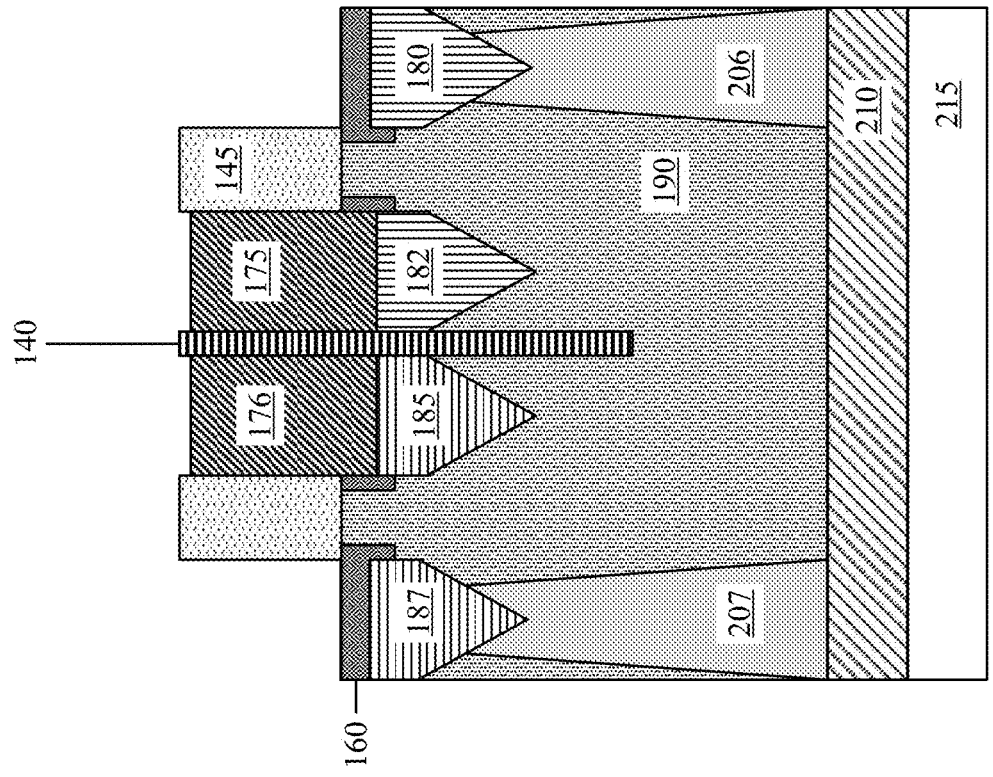
FIG. 27 illustrates a cross section Y2 of the source/drain region after the removal of the etch stop and the second substrate, in accordance with the embodiment of the present invention.
Figure 26:
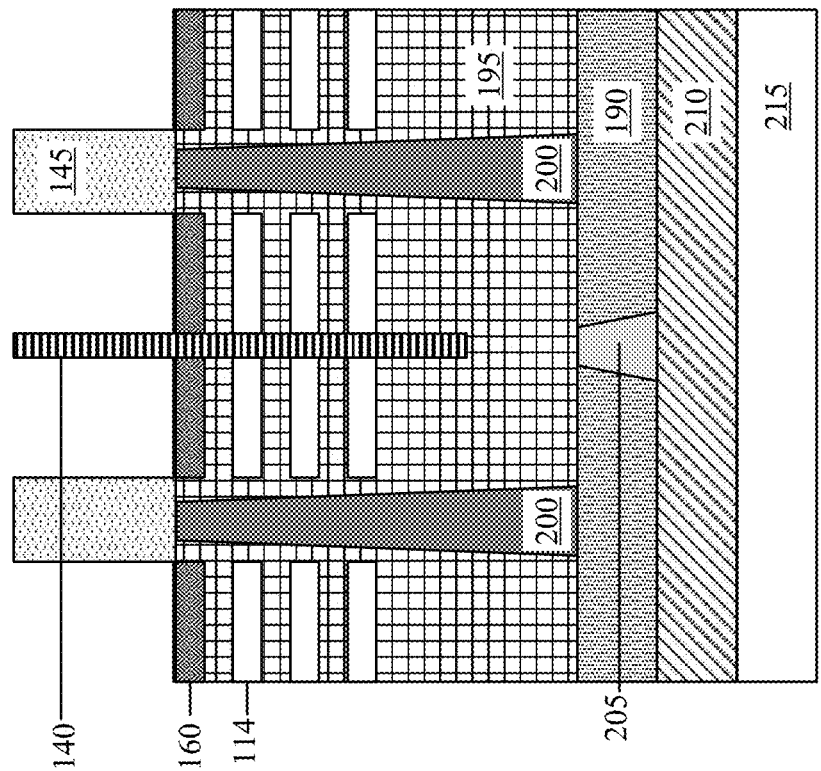
FIG. 26 illustrates a cross section Y1 of the gate region after the removal of the etch stop and the second substrate, in accordance with the embodiment of the present invention.
Figure 28:
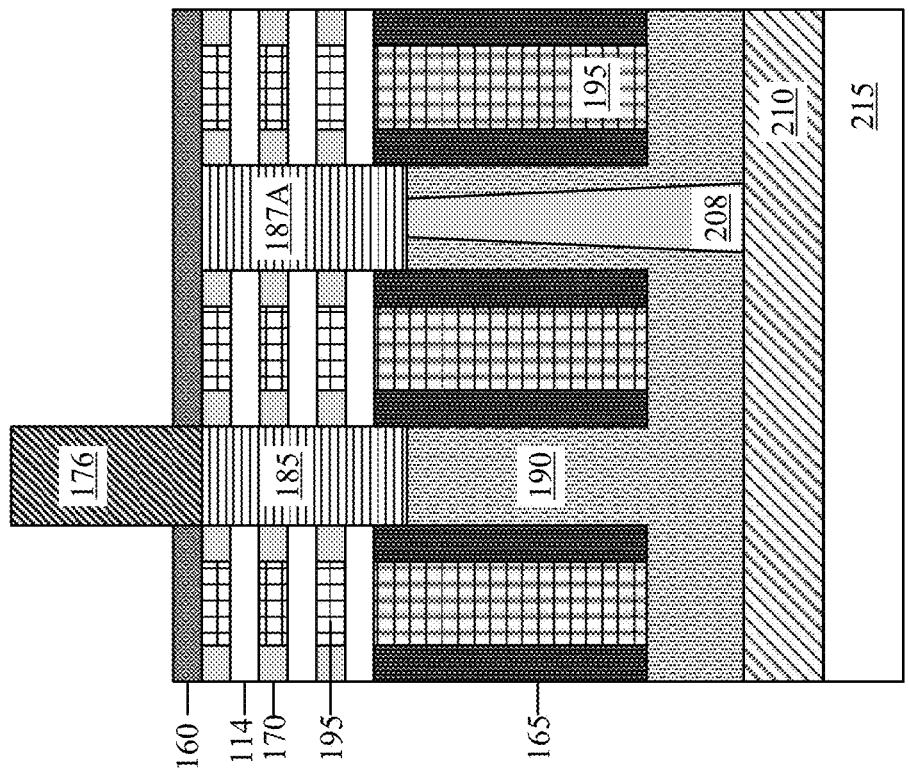
FIG. 28 illustrates a cross section X of the across the nano device after the removal of the etch stop and the second substrate, in accordance with the embodiment of the present invention.

FIGS. 26, 27, and 28 illustrates the processing stage after the removal of the etch stop 107 and the second substrate 110. The etch stop 107 and the second substrate 110 are removed. The removal of these layer exposes the shallow trench isolation layer 145 and a portion of the dielectric bar 140 that was located within the second substrate 110, as seen in FIG. 26. As illustrated by FIG. 27, a sidewall surface of the shallow trench isolation layer 145 is exposed, a backside surface of the first backside placeholder 175, a backside surface of the second backside placeholder 176, a backside surface of the bottom dielectric isolation layer 160, and a backside surface of the dielectric bar 140 is exposed. FIG. 28 illustrates that the second backside placeholder 176 and a backside surface of the bottom dielectric layer 160 are exposed by the removal of the second substrate 110.

Figure 30:
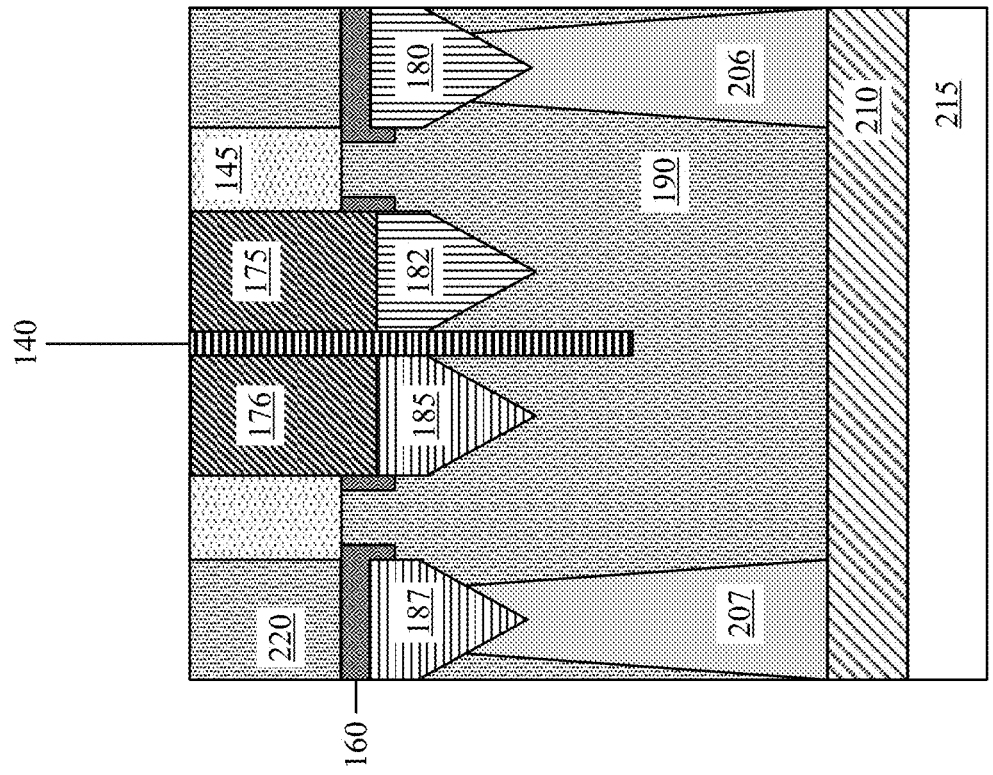
FIG. 30 illustrates a cross section Y2 of the source/drain region after the formation of a backside interlayer dielectric layer and a CMP process, in accordance with the embodiment of the present invention.
Figure 29:
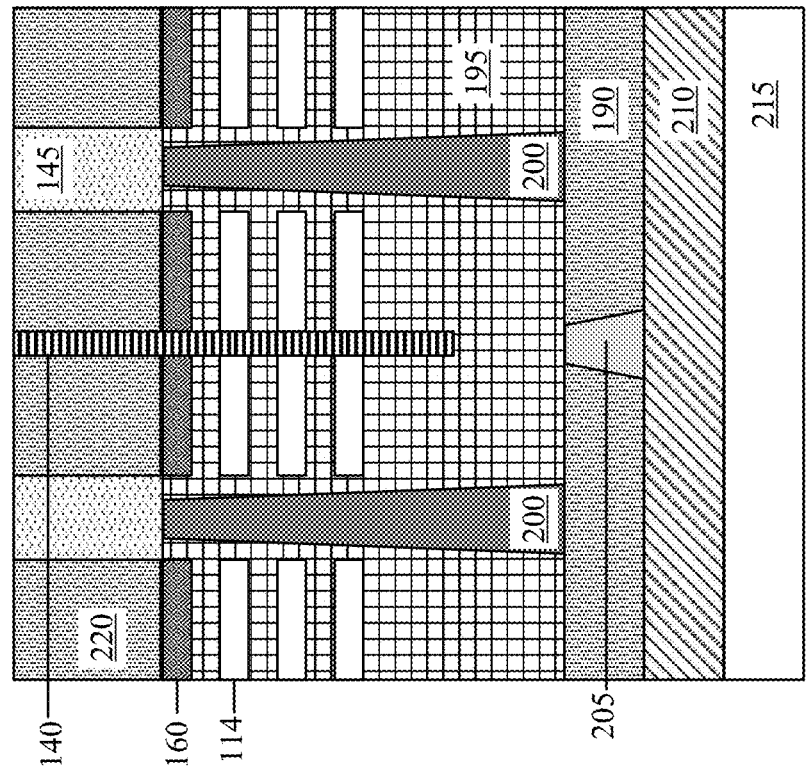
FIG. 29 illustrates a cross section Y1 of the gate region after the formation of a backside interlayer dielectric layer and a CMP process, in accordance with the embodiment of the present invention.
Figure 31:
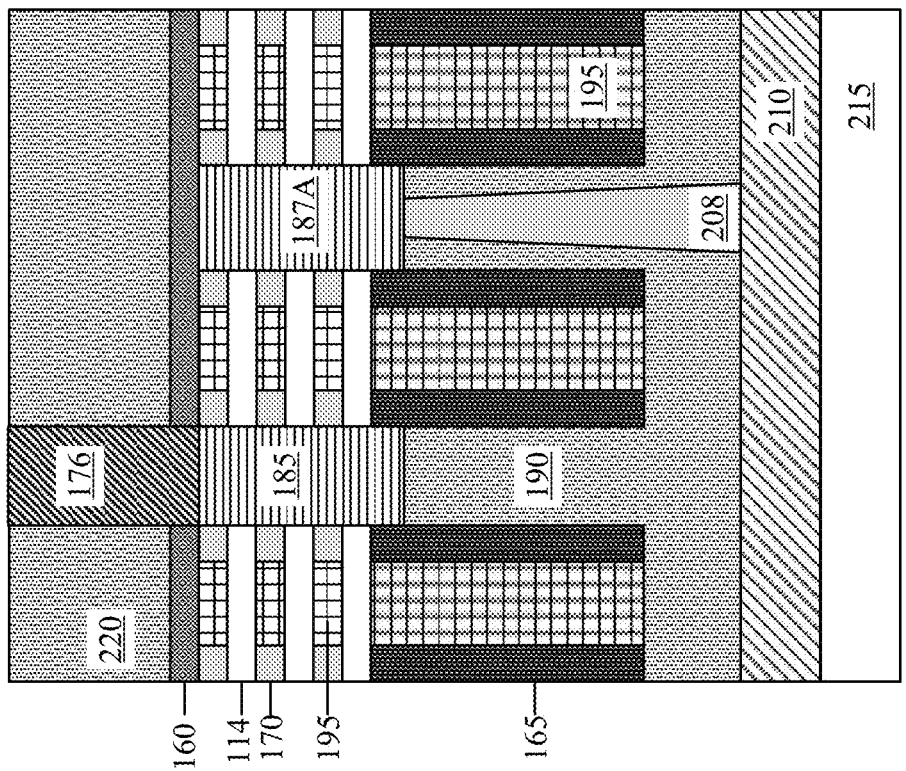
FIG. 31 illustrates a cross section X of the across the nano device after the formation of a backside interlayer dielectric layer and a CMP process, in accordance with the embodiment of the present invention.

FIGS. 29, 30, and 31 illustrates the processing stage after formation of a backside interlayer dielectric layer 220 and a chemical-mechanical planarization (CMP) process. A backside interlayer dielectric layer 220 is formed on the exposed backside surfaces. The backside interlayer dielectric layer 220 is CMP to form a uniform surface across the backside interlayer dielectric layer 220, the shallow trench isolation layer 145, the dielectric bar 140, the first backside placeholder 175, and the second backside placeholder 176.

Figure 33:
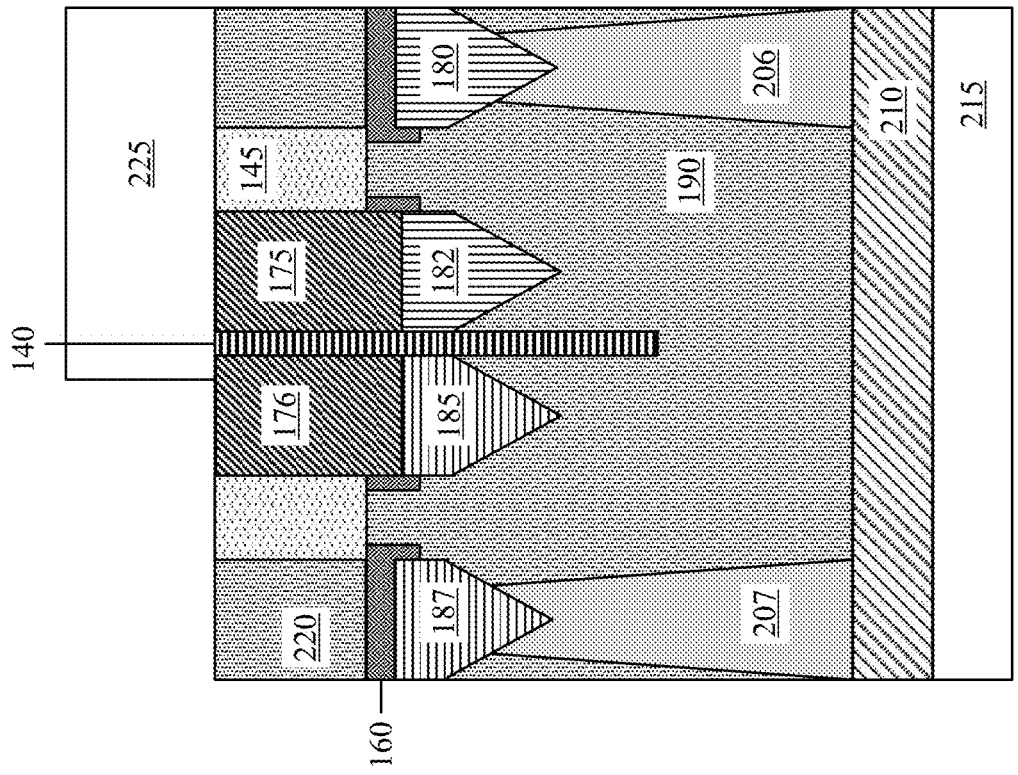
FIG. 33 illustrates a cross section Y2 of the source/drain region after the formation of a first lithography layer, in accordance with the embodiment of the present invention.
Figure 32:
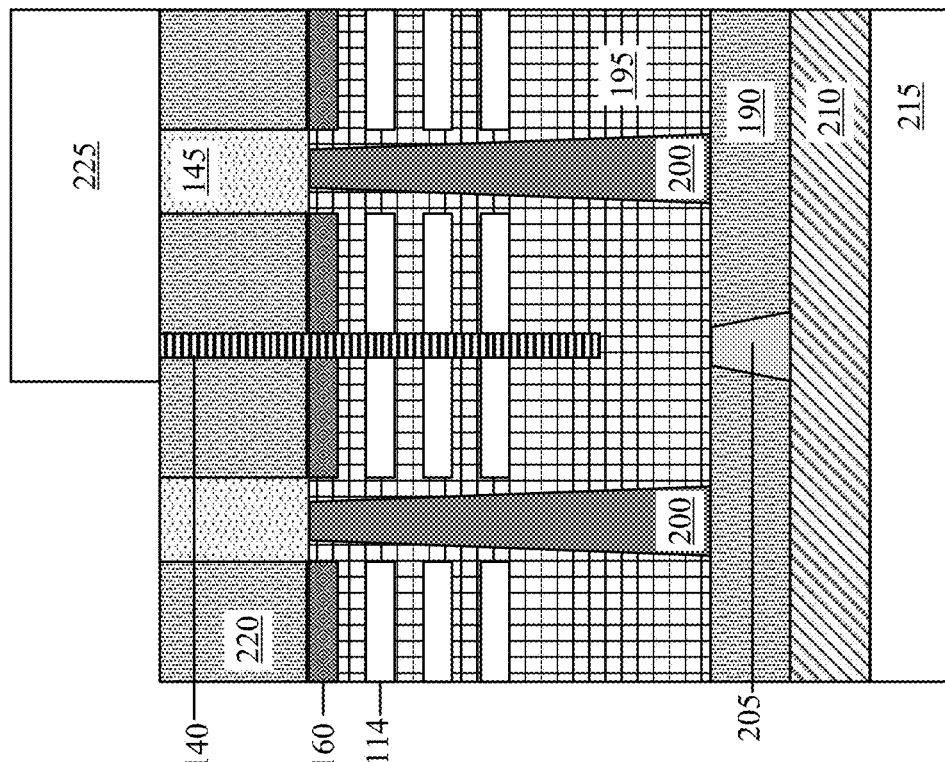
FIG. 32 illustrates a cross section Y1 of the gate region after the formation of a first lithography layer, in accordance with the embodiment of the present invention.
Figure 34:
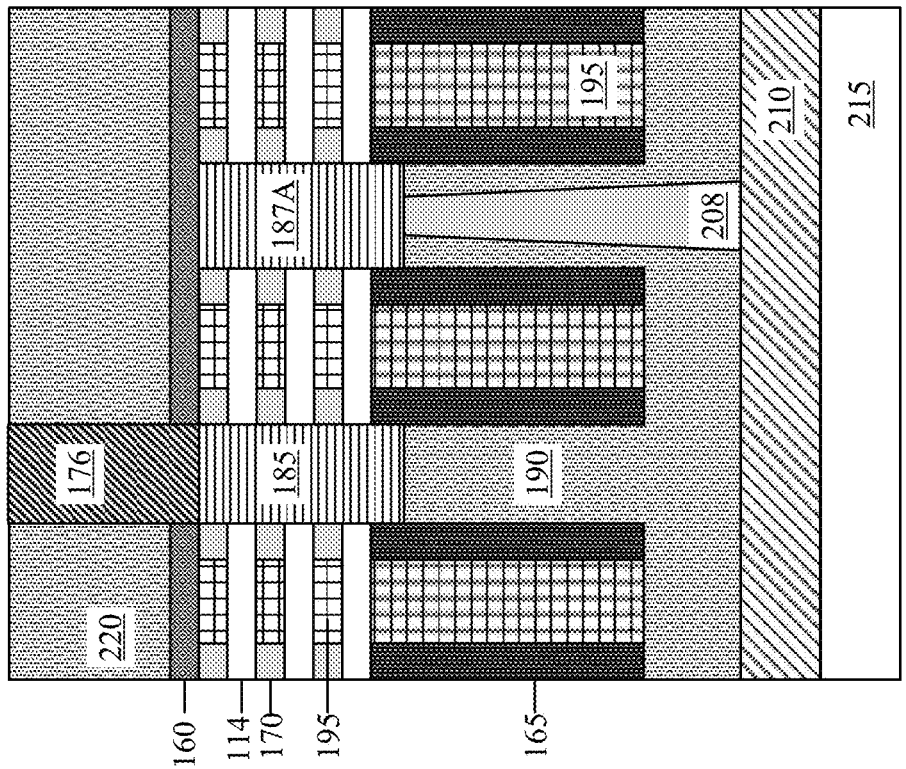
FIG. 34 illustrates a cross section X of the across the nano device after the formation of a first lithography layer, in accordance with the embodiment of the present invention.

FIGS. 32, 33, and 34 illustrates the processing stage after the formation of a first lithography layer 225. A first lithography layer 225 is formed on top of the backside interlayer dielectric layer 220, the shallow trench isolation layer 145, the dielectric bar 140, the first backside placeholder 175, and the second backside placeholder 176. The first lithography layer 225 is pattern to expose a backside surface of the second backside placeholder 176. The first lithography layer 225 still remains on top of the first backside placeholder 175. The first lithography layer 225 needs to completely cover the first backside placeholder 175 after the patterning to expose the second backside placeholder 176 to prevent the early removal of the first backside placeholder 175.

Figure 36:
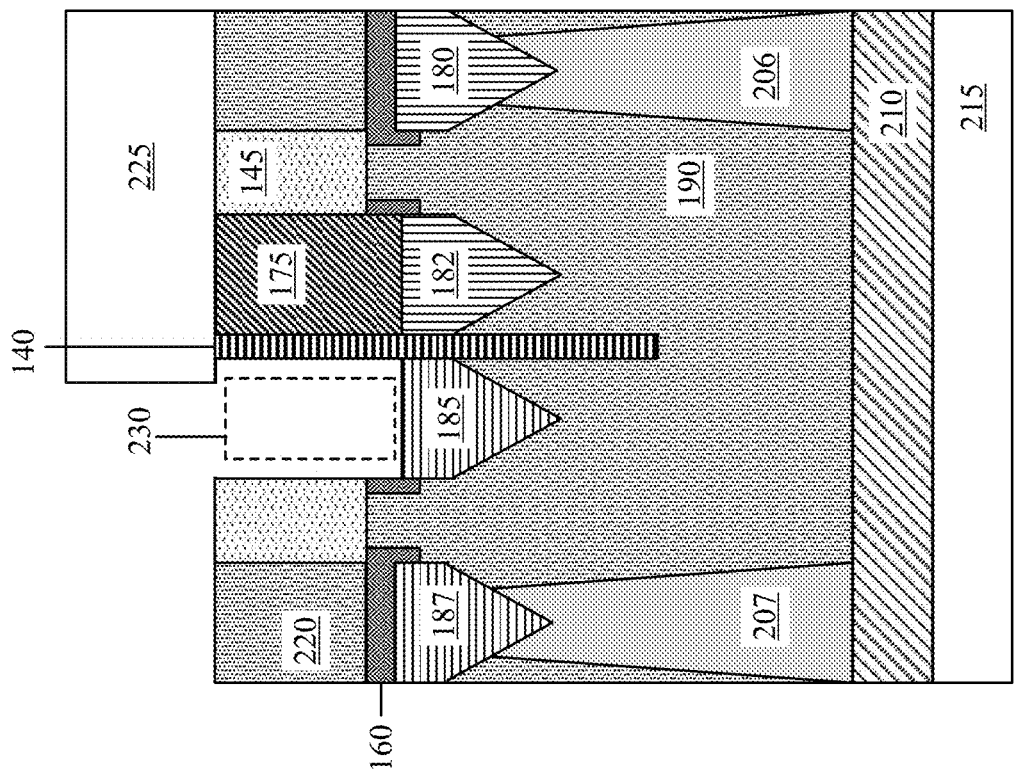
FIG. 36 illustrates a cross section Y2 of the source/drain region after the removal of the second backside placeholder, in accordance with the embodiment of the present invention.
Figure 35:
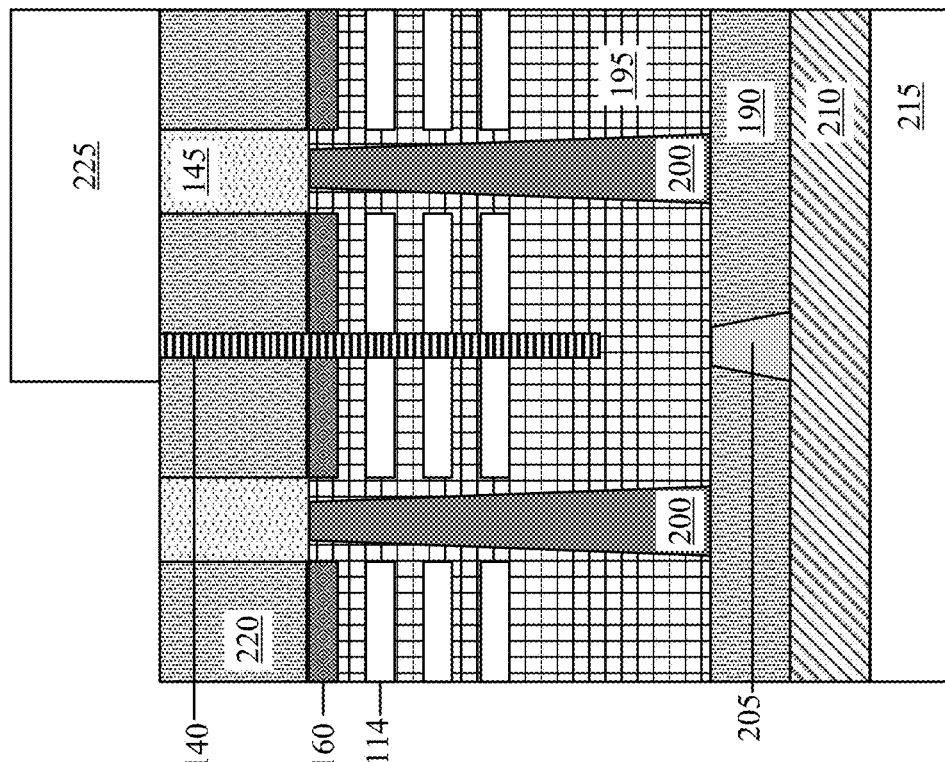
FIG. 35 illustrates a cross section Y1 of the gate region after the removal of the second backside placeholder, in accordance with the embodiment of the present invention.
Figure 37:
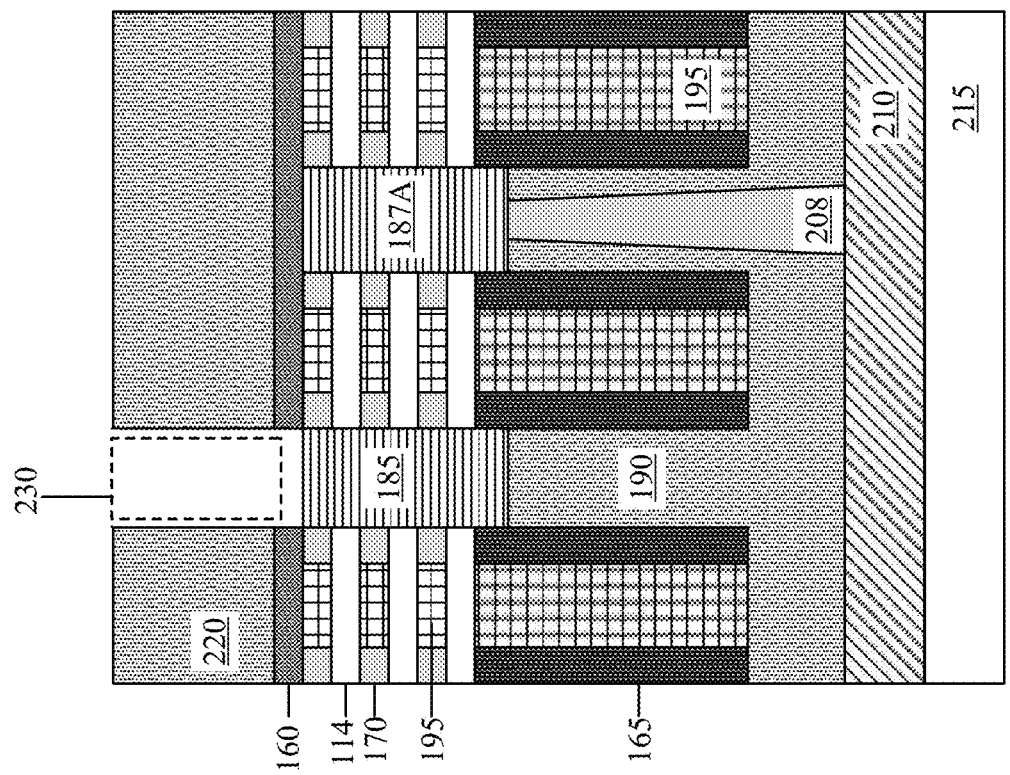
FIG. 37 illustrates a cross section X of the across the nano device after the removal of the second backside placeholder, in accordance with the embodiment of the present invention.

FIGS. 35, 36, and 37 illustrates the processing stage after the removal of the second backside placeholder 176. The second backside placeholder 176 is removed to create a cavity 230. The cavity 230 exposes a backside surface of a second type of source/drain 185. The cavity 230 further exposes a sidewall of the dielectric bar 140, a sidewall of the shallow trench isolation layer 145 and a sidewall of the bottom dielectric layer 160.

Figure 39:
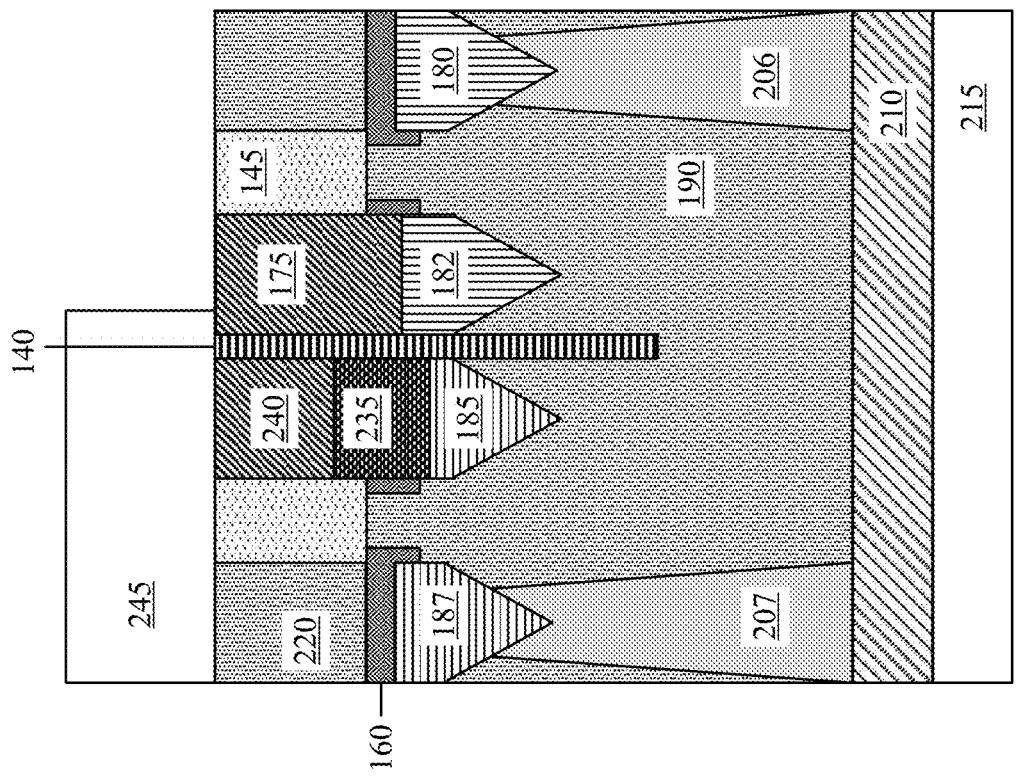
FIG. 39 illustrates a cross section Y2 of the source/drain region after the recess of the second type of source/drain, forming a first backside source/drain epi, forming a third backside placeholder and forming a second lithography layer, in accordance with the embodiment of the present invention.
Figure 38:
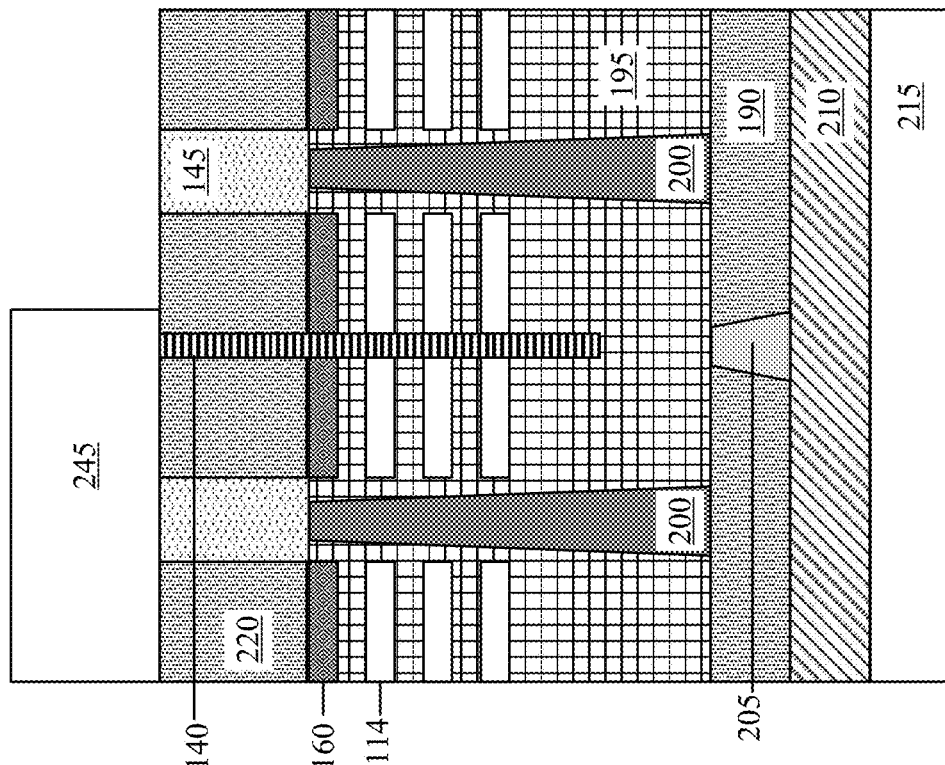
FIG. 38 illustrates a cross section Y1 of the gate region after the recess of the second type of source/drain, forming a first backside source/drain epi, forming a third backside placeholder and forming a second lithography layer, in accordance with the embodiment of the present invention.
Figure 40:
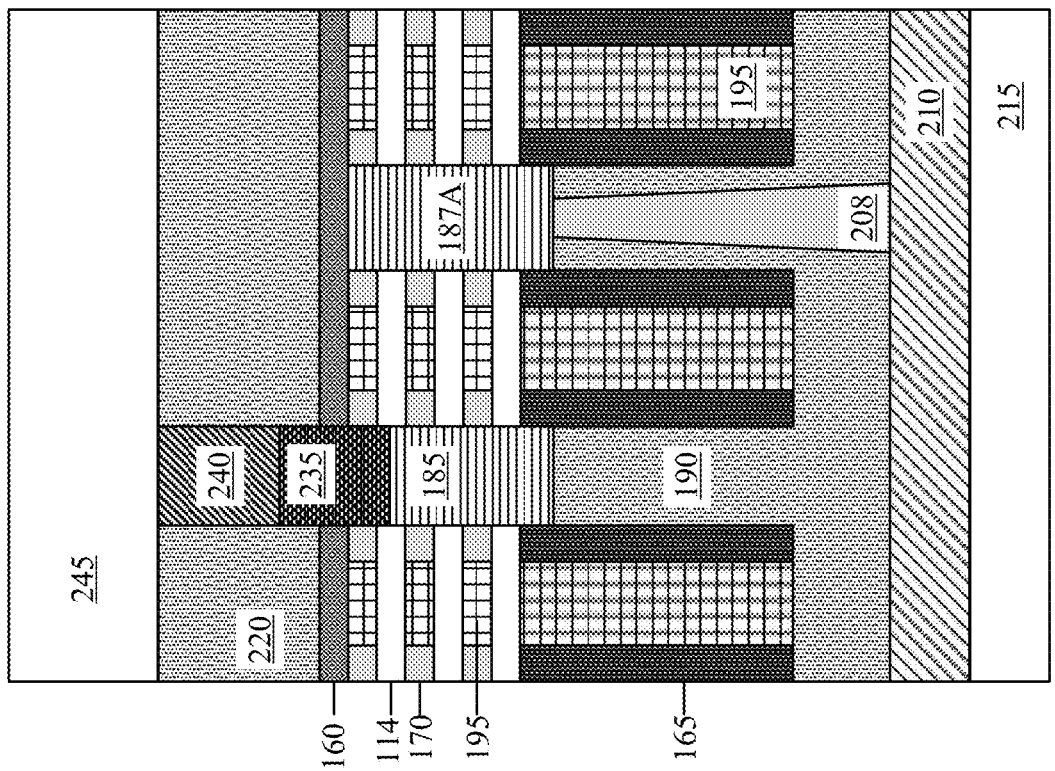
FIG. 40 illustrates a cross section X of the across the nano device after the recess of the second type of source/drain, forming a first backside source/drain epi, forming a third backside placeholder and forming a second lithography layer, in accordance with the embodiment of the present invention.

FIGS. 38, 39, and 40 illustrates the processing stage after the recess of the second type of source/drain 185, forming a first backside source/drain epi 235, forming a third backside placeholder 240, and forming a second lithography layer 245. The second type of source/drain 185 is recessed to create additional space within cavity 230. A first backside source/drain epi 235 is formed on the backside surface of the second type of source/drain epi 185. The first backside source/drain epi 235 is the same type of epi (i.e., n-type or p-type) as the second type of source/drain 185. A major difference between the first backside source/drain epi 235 and the second type of source/drain 185 is the doping concentration. The second type of source/drain 185 tends to have a low doping concentration to prevent diffusion of the doping agent into the channel layers 114 during an annealing processing stage. However, at this stage of processing a high temperature annealing process is no longer needed, so a higher concentration of doping agent can be used in the first backside source/drain epi 235. A gradient will form at the interface of the second type of source/drain 185 and the first backside source/drain epi 235, however these are still two distinct layers. The first backside source/drain epi 235 does not fill the cavity 230. The first backside source/drain epi 235 has a first sidewall that is flush against the dielectric bar 140. The first backside source/drain epi 235 has a second sidewall that is in direct contact with the bottom dielectric layer 160 and the shallow trench isolation layer 145. A third backside placeholder 240 is formed on the exposed surface (i.e., the top surface) of the first backside source/drain epi 235 within the cavity 230. A second lithography layer 245 is formed on the exposed surfaces of the backside interlayer dielectric layer 220, the third backside placeholder 240, the shallow trench isolation layer 145, the dielectric bar 140, and the first backside placeholder 175. The second lithography layer 245 is patterned to expose a backside surface of the first backside placeholder 175.

Figure 42:
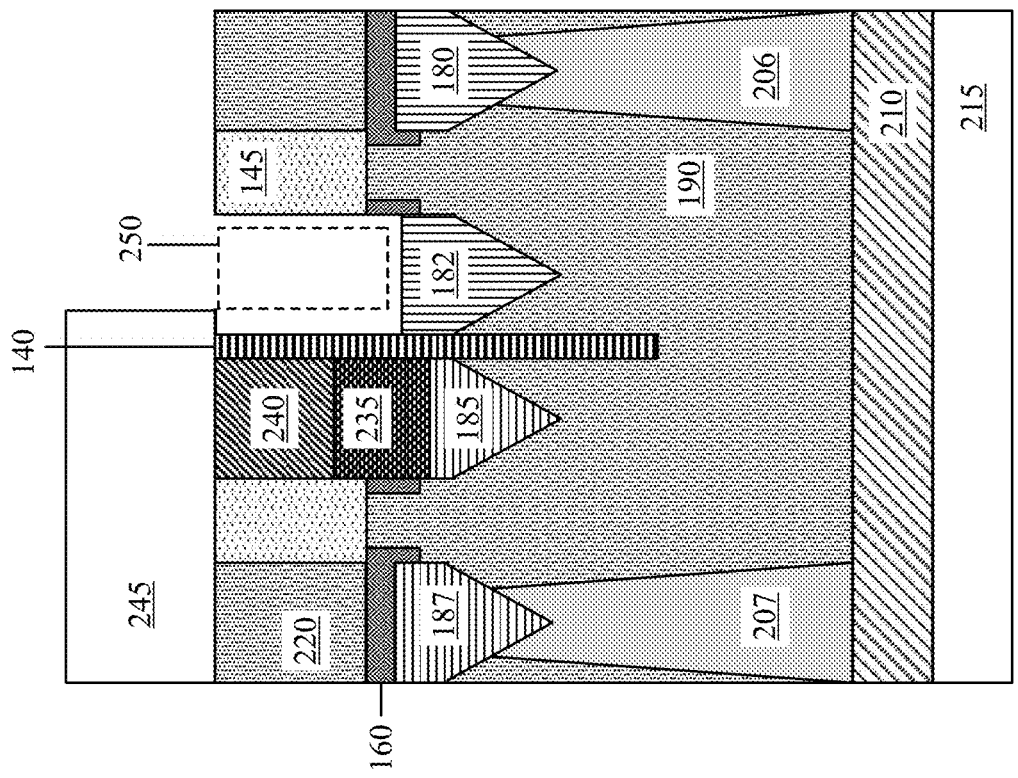
FIG. 42 illustrates a cross section Y2 of the source/drain region after the removal of the first backside placeholder, in accordance with the embodiment of the present invention.
Figure 41:
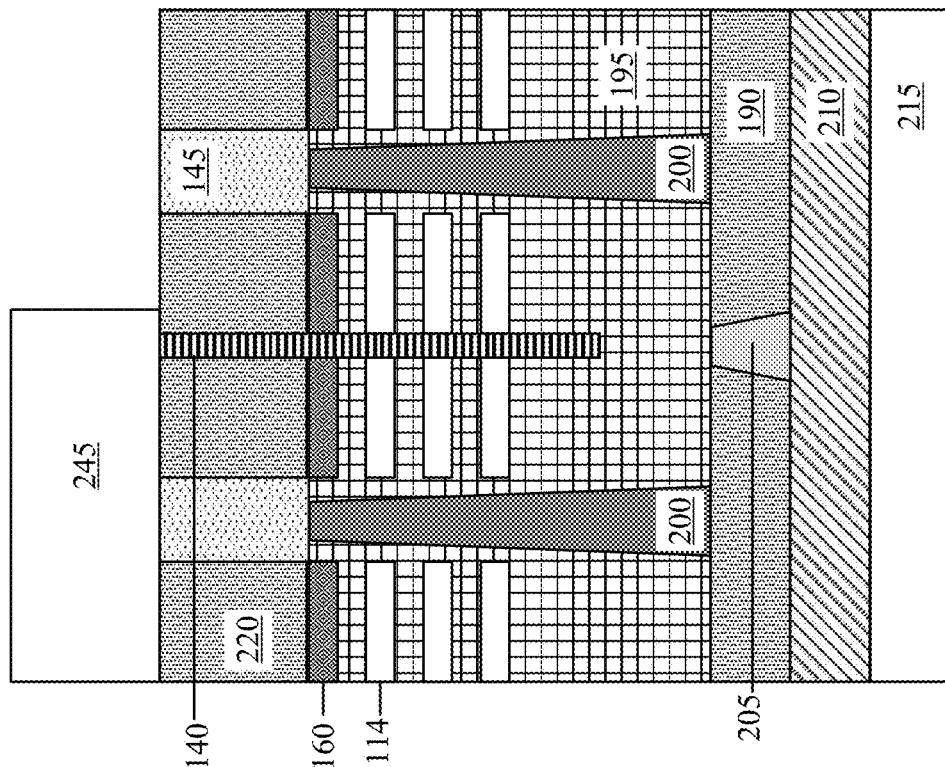
FIG. 41 illustrates a cross section Y1 of the gate region after the removal of the first backside placeholder, in accordance with the embodiment of the present invention.
Figure 43:
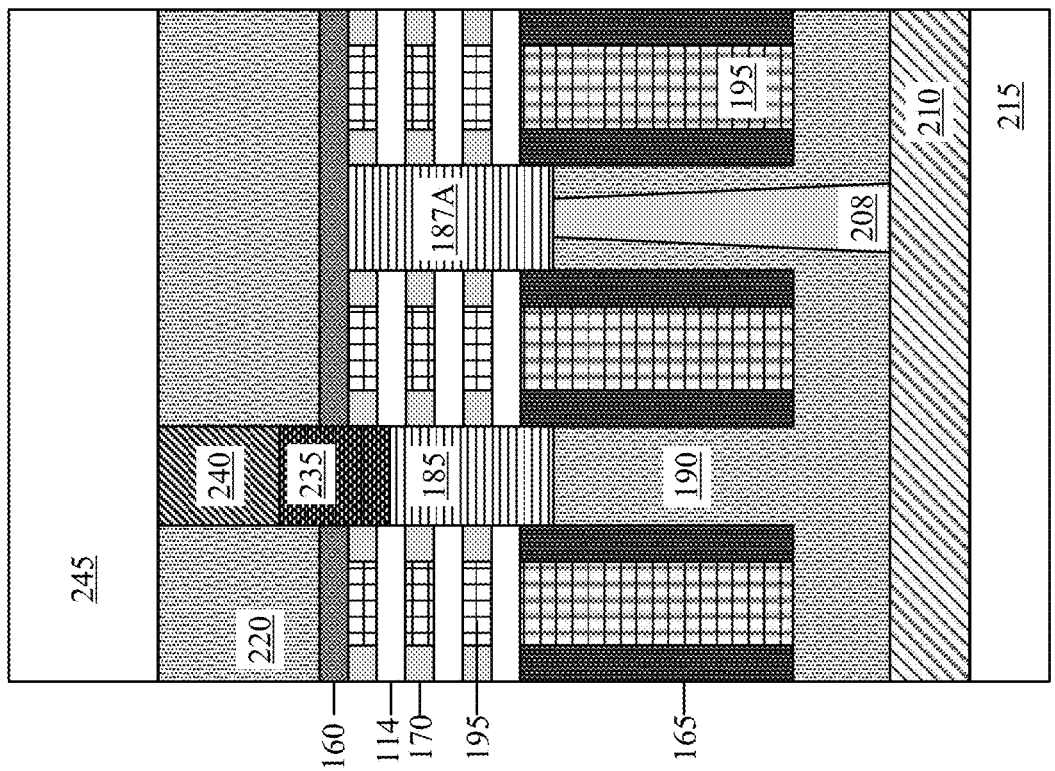
FIG. 43 illustrates a cross section X of the across the nano device after the removal of the first backside placeholder, in accordance with the embodiment of the present invention.

FIGS. 41, 42, and 43 illustrates the processing stage after the removal of the first backside placeholder 175. The first backside placeholder 175 is removed to create a second cavity 250. The second cavity 250 exposes a backside surface of a first type of source/drain 182. The second cavity 250 further exposes a sidewall of the dielectric bar 140, a sidewall of the shallow trench isolation layer 145 and a sidewall of the bottom dielectric layer 160.

Figure 45:
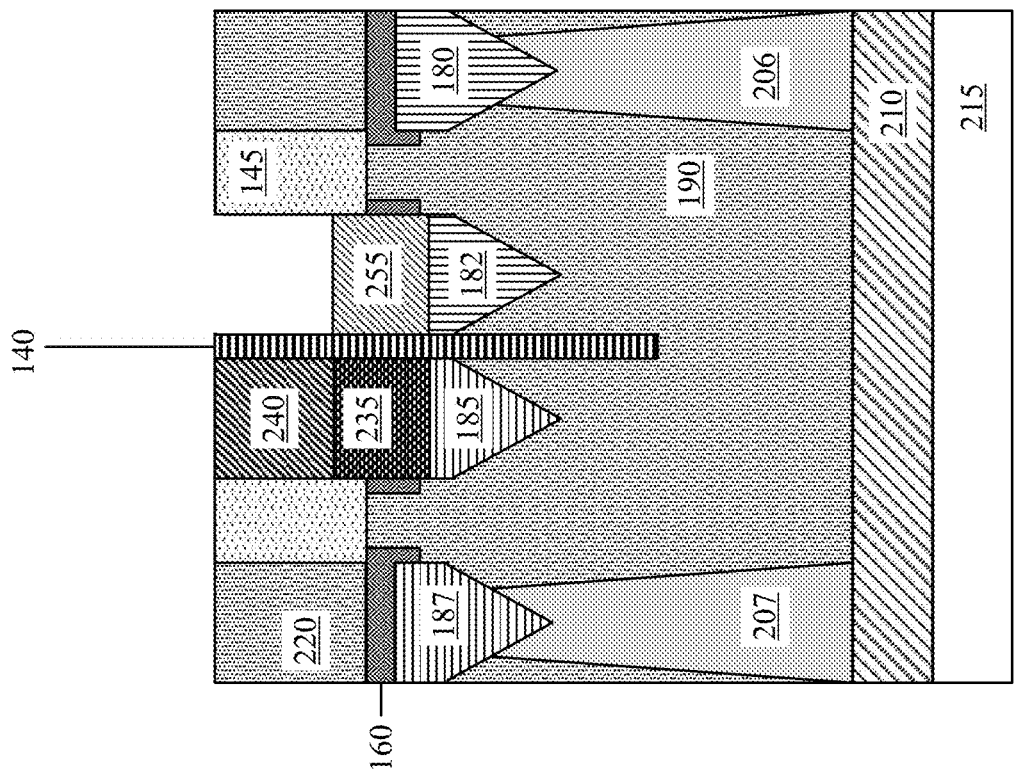
FIG. 45 illustrates a cross section Y2 of the source/drain region after the removal of the second lithography layer and the formation of a second backside source/drain epi, in accordance with the embodiment of the present invention.
Figure 44:
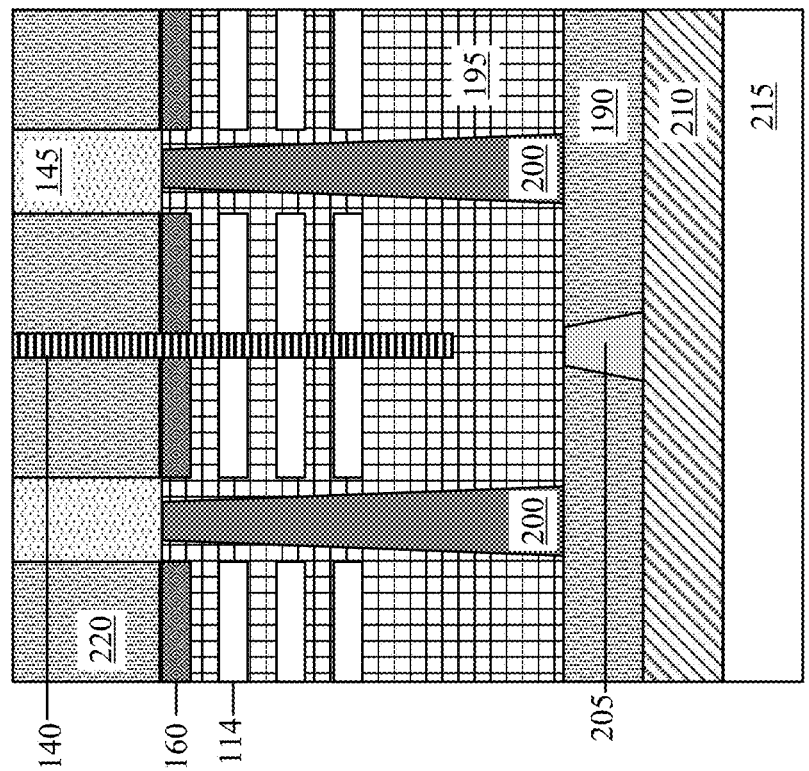
FIG. 44 illustrates a cross section Y1 of the gate region after the removal of the second lithography layer and the formation of a second backside source/drain epi, in accordance with the embodiment of the present invention.
Figure 46:
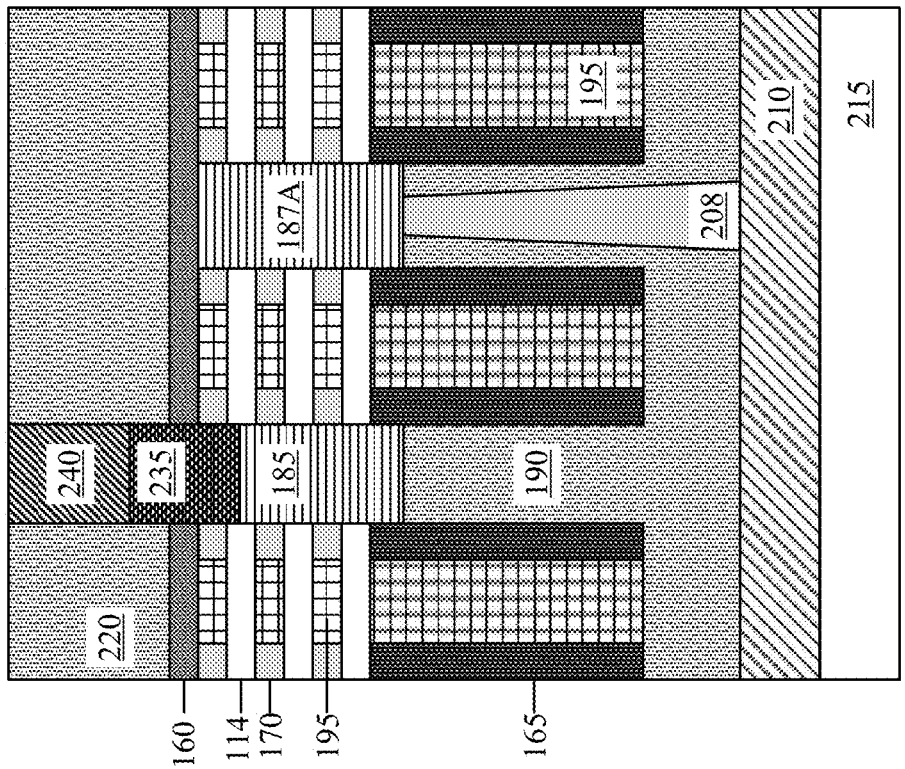
FIG. 46 illustrates a cross section X of the across the nano device after the removal of the second lithography layer and the formation of a second backside source/drain epi, in accordance with the embodiment of the present invention.

FIGS. 44, 45, and 46 illustrates the processing stage after the removal of the second lithography layer 245 and the formation of a second backside source/drain epi 255. The second lithography layer 245 is removed. The first type of source/drain 182 is recessed to create additional space within the second cavity 250. A second backside source/drain epi 255 is formed on the backside surface of the first type of source/drain epi 182. The second backside source/drain epi 255 is the same type of epi (i.e., n-type or p-type) as the first type of source/drain 182. A major difference between the second backside source/drain epi 255 and the first type of source/drain 182 is the doping concentration. The first type of source/drain 182 tends to have a low doping concentration to prevent diffusion of the doping agent into the channel layers 114 during an annealing processing stage. However, at this stage of processing a high temperature annealing process is no longer needed, so a higher concentration of doping agent can be used in the second backside source/drain epi 255. A gradient will form at the interface of the first type of source/drain 182 and the second backside source/drain epi 255, however these are still two distinct layers. The second backside source/drain epi 255 does not fill the second cavity 250. The second backside source/drain epi 255 has a first sidewall that is flush against the dielectric bar 140. The second backside source/drain epi 255 has a second sidewall that is in direct contact with the bottom dielectric layer 160 and the shallow trench isolation layer 145.

Figure 48:
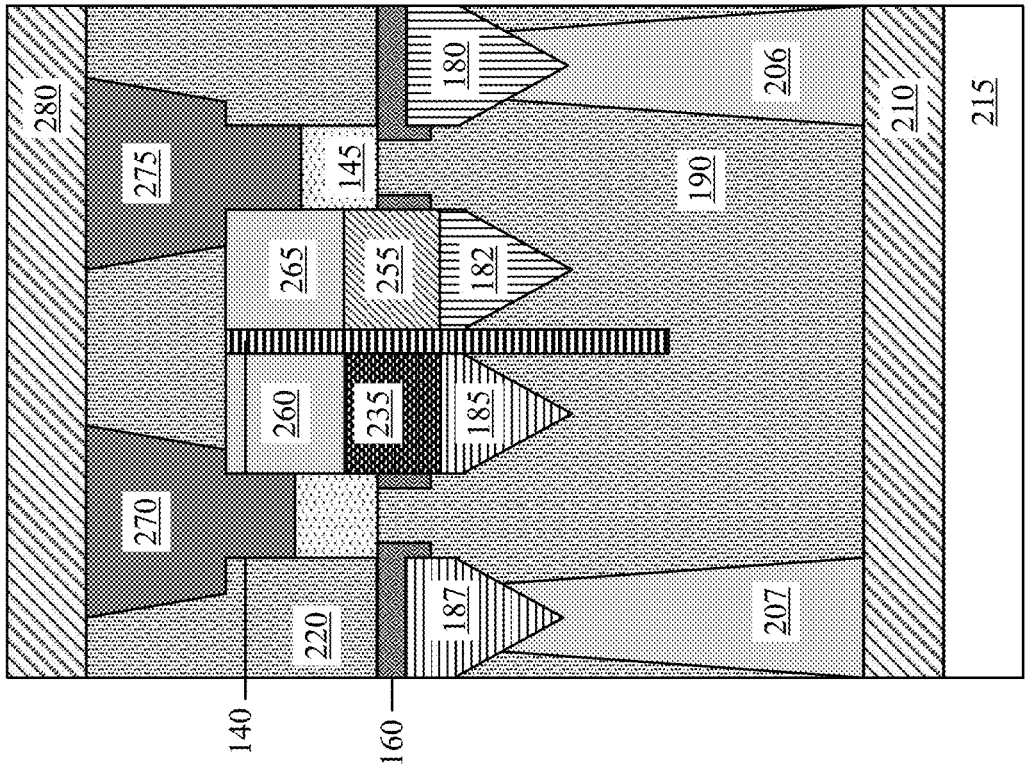
FIG. 48 illustrates a cross section Y2 of the source/drain region after the formation of a first backside contact, a second backside contact, additional backside interlayer dielectric layer, a first backside connector, a second backside connector, and a backside interconnect, in accordance with the embodiment of the present invention.
Figure 47:
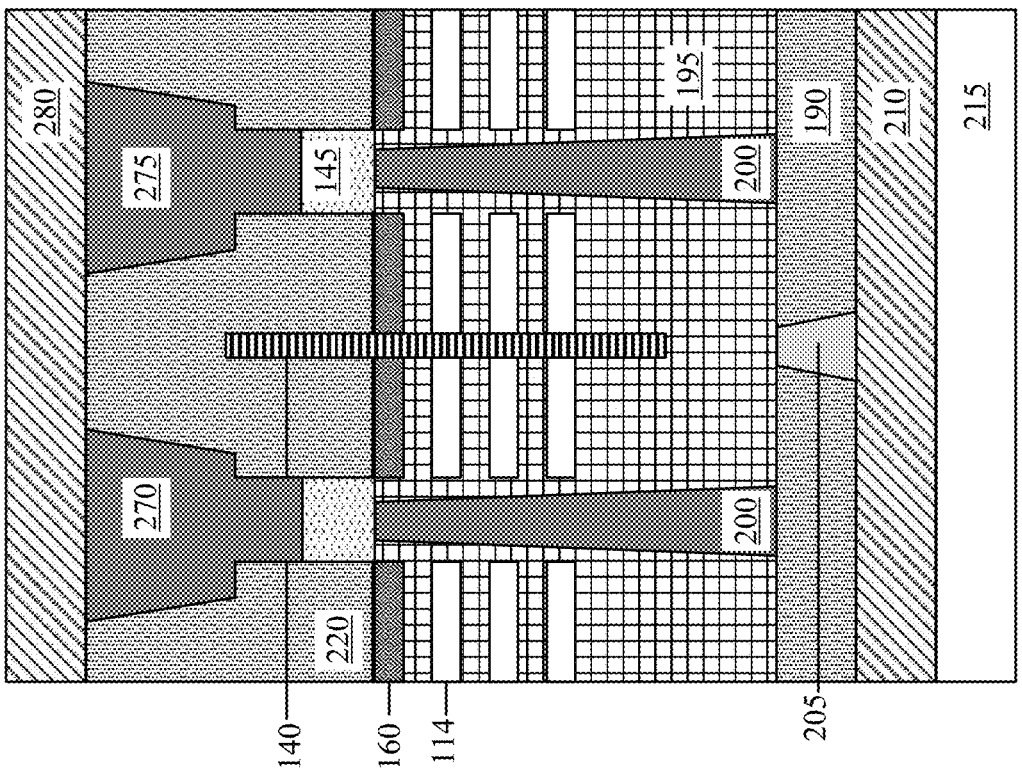
FIG. 47 illustrates a cross section Y1 of the gate region after the formation of a first backside contact, a second backside contact, additional backside interlayer dielectric layer, a first backside connector, a second backside connector, and a backside interconnect, in accordance with the embodiment of the present invention.
Figure 49:
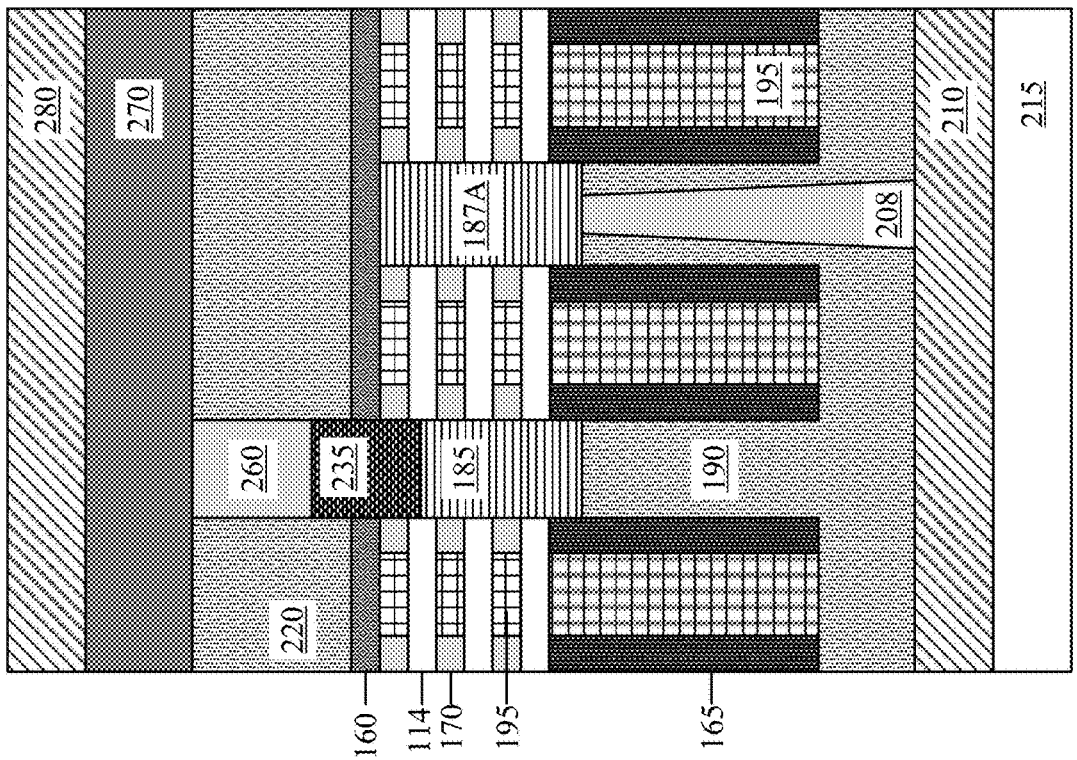
FIG. 49 illustrates a cross section X of the across the nano device after the formation of a first backside contact, a second backside contact, additional backside interlayer dielectric layer, a first backside connector, a second backside connector, and a backside interconnect, in accordance with the embodiment of the present invention.

FIGS. 47, 48, and 49 illustrates the processing stage after the formation of a first backside contact 260, a second backside contact 265, additional backside interlayer dielectric layer 220, a first backside connector 270, a second backside connector 275, and a backside interconnect 280. The third backside placeholder 240 is removed to create an open space located above the first backside source/drain epi 235. A metallization process is used to form a first backside contact 260 and a second backside contact 265. The first backside contact 260 has a bottom surface that is in contact with the backside surface of the first backside source/drain epi 235. The first backside contact 260 has a sidewall that is flush against the dielectric bar 140. The second backside contact 265 has a bottom surface that is in contact with the backside surface of the second backside source/drain epi 255. The second backside contact 265 has a sidewall that is flush against the dielectric bar 140.

Additional backside interlayer dielectric layer 220 material is formed on top of the first backside contact 260, the second backside contact 265, the backside interlayer dielectric layer 220, and on top of the dielectric bar 140. Trenches (not shown) are formed in the backside interlayer dielectric layer 220 and a portion of the shallow trench isolation layer 145 is removed. One of the trenches (not shown) exposes a portion of the top surface of the first backside contact 260 and a portion of a sidewall of the first backside contact 260. Another trench (not shown) exposes a portion of the top surface of the second backside contact 265 and a portion of a sidewall of the second backside contact 265. A metallization process fills the trenches in to form a first backside connector 270 and a second backside connector 275. The first backside connector 270 has a T-shape, such that the first backside connector 270 is in direct contact with a portion of the top surface of the first backside contact 260 and is in direct contact with a portion of a sidewall of the first backside contact 260. The second backside connector 275 has a T-shape, such that the second backside connector 275 is in direct contact with a portion of the top surface of the second backside contact 265 and is in direct contact with a portion of a sidewall of the second backside contact 265. A backside interconnect 280 is formed on top of the backside interlayer dielectric layer 220, the first backside connector 270, and the second backside connector 275.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
    a first transistor including a plurality of first channel layers;
    a second transistor including a plurality of second channel layers, wherein the first transistor is located adjacent to the second transistor;
    a dielectric bar located between the first transistor and the second transistor;
    a first source/drain of the first transistor is located on a first side of the dielectric bar and a second source/drain of the second transistor is located on a second side of the dielectric bar, wherein the first side is opposite the second side;
    a first backside contact connected to the first source/drain, wherein the first backside contact is in contact with the first side of the dielectric bar; and
    a second backside contact connected to the second source/drain, wherein the second backside contact is in contact with the second side of dielectric bar.

2. The microelectronic structure of claim 1, further comprising:
    a first connector connected to the first backside contact; and
    a second connector connected to the second backside contact.

3. The microelectronic structure of claim 2, wherein the first connector and the second connector are T-shaped.

4. The microelectronic structure of claim 3, wherein the first connector is in direct contact with a top surface and a side surface of the first backside contact.

5. The microelectronic structure of claim 4, wherein the second connector is in direct contact with a top surface of the second backside contact and the second connector is in direct contact with the side surface of the second contact.

6. The microelectronic structure of claim 5, further comprising:
    a first shallow trench isolation layer located adjacent to the first source/drain, and located adjacent to the first backside contact;
    a second shallow trench isolation layer located adjacent to the second source/drain and located adjacent to the second backside contact.

7. The microelectronic structure of claim 6, wherein the first connector is in contact with the first shallow trench isolation layer, and wherein the second connector is in contact with the second shallow trench isolation layer.

8. A microelectronic structure comprising:
    a first transistor including a plurality of first channel layers;
    a second transistor including a plurality of second channel layers, wherein the first transistor is located adjacent to the second transistor;
    a dielectric bar located between the first transistor and the second transistor;
    a first source/drain of the first transistor is comprised of a first source/drain layer and a second source/drain layer, wherein the second source/drain layer is located on the backside of the first source/drain layer, wherein the first source/drain layer and the second source/drain layer are flush against a first sidewall of the dielectric bar; and
    a second source/drain of the second transistor comprised of a third source/drain layer and a fourth source/drain layer, wherein the fourth source/drain layer is located on a backside of the third source/drain layer, wherein the third source/drain layer and the fourth source/drain layer are flush against a second sidewall of the dielectric bar.

9. The microelectronic structure of claim 8, wherein the first source/drain layer and the second source/drain layer are the same type of source/drain epi, wherein a dopant concentration of the second source/drain layer is higher than a dopant concentration of the first source/drain layer.

10. The microelectronic structure of claim 9, wherein the first source/drain layer and the second source/drain layer are distinct layers.

11. The microelectronic structure of claim 10, wherein the third source/drain layer and the fourth source/drain layer are the same type source/drain epi, wherein a dopant concentration of the fourth source/drain layer is higher than a dopant concentration of the third source/drain layer.

12. The microelectronic structure of claim 11, wherein the third source/drain layer and the fourth source/drain layer are distinct layers.

13. The microelectronic structure of claim 12, further comprising:
a first backside contact connected to the second source/drain layer of the first source/drain, wherein the first backside contact is in contact with the first sidewall of the dielectric bar.

14. The microelectronic structure of claim 13, further comprising:
a second backside contact connected to the fourth source/drain layer of the second source/drain, wherein the second backside contact is in contact with the second sidewall of dielectric bar.

15. The microelectronic structure of claim 14, further comprising:
a first connector connected to the first backside contact; and
a second connector connected to the second backside contact.

16. The microelectronic structure of claim 15, wherein the first connector and the second connector are T-shaped.

17. The microelectronic structure of claim 16, wherein the first connector is in direct contact with a top surface of the first backside contact and the first connector is in direct contact with the side surface of the first backside contact.

18. The microelectronic structure of claim 17, wherein the second connector is in direct contact with a top surface of the second contact and the second connector is in direct contact with the side surface of the second contact.

19. A method comprising:
forming a first transistor including a plurality of first channel layers;
forming a second transistor including a plurality of second channel layers, wherein the first transistor is located adjacent to the second transistor;
forming a dielectric bar located between the first transistor and the second transistor;
forming a first source/drain of the first transistor located on a first side of the dielectric bar and a second source/drain of the second transistor located on a second side of the dielectric bar, wherein the first side is opposite the second side;
forming a first backside contact connected to the first source/drain, wherein the first backside contact is in contact with the first side of the dielectric bar; and
forming a second backside contact connected to the second source/drain, wherein the second backside contact is in contact with the second side of dielectric bar.

20. The method of claim 19,
wherein the first source/drain of the first transistor is comprised of a first source/drain layer and a second source/drain layer, wherein the second source/drain layer is located on the backside of the first source/drain layer, wherein the first source/drain layer and the second source/drain layer are the same type source/drain epi, wherein a dopant concentration of the second source/drain layer is higher than a dopant concentration of the first source/drain layer; and
wherein the second source/drain of the second transistor comprised of a third source/drain layer and the fourth source/drain layer, wherein the fourth source/drain layer is located on a backside of the third source/drain layer, wherein the third source/drain layer and the fourth source/drain layer are the same type source/drain epi, wherein a dopant concentration of the fourth source/drain layer is higher than a dopant concentration of the third source/drain layer.

\* \* \* \* \*